United States Patent
Kang

(10) Patent No.: US 11,094,867 B2
(45) Date of Patent: Aug. 17, 2021

(54) DISPLAY DEVICE AND METHOD OF MANUFACTURING THE SAME

(71) Applicant: LG Display Co., Ltd., Seoul (KR)

(72) Inventor: HanSaem Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/570,305

(22) Filed: Sep. 13, 2019

(65) Prior Publication Data
US 2020/0168777 A1 May 28, 2020

(30) Foreign Application Priority Data
Nov. 23, 2018 (KR) .......................... 10-2018-0146509

(51) Int. Cl.
*H01L 33/62* (2010.01)
*H01L 33/36* (2010.01)
*H01L 33/52* (2010.01)
*H01L 27/15* (2006.01)

(52) U.S. Cl.
CPC ............ *H01L 33/62* (2013.01); *H01L 27/156* (2013.01); *H01L 33/36* (2013.01); *H01L 33/52* (2013.01);
(Continued)

(58) Field of Classification Search
CPC ....... H01L 33/62; H01L 27/156; H01L 33/36; H01L 33/52; H01L 2933/0016; H01L 2933/005; H01L 2933/0066; H01L 25/167; H01L 33/385; H01L 25/0753; H01L 27/3248; H01L 27/3244; H01L 27/3258; H01L 27/15; H01L 33/005; H01L 33/38;
(Continued)

(56) References Cited

U.S. PATENT DOCUMENTS 9,978,728 B2 5/2018 Lin et al.
10,319,880 B2 6/2019 Lee et al.
(Continued)

FOREIGN PATENT DOCUMENTS

CN 104282678 A 1/2015
EP 1 848 026 A1 10/2007
(Continued)

OTHER PUBLICATIONS

Kim et al., Light Emitting Device and Display Device Using The Same, KR_101888857, p. 9-13. (Year: 2018).*
(Continued)

*Primary Examiner* — Caleen O Sullivan
(74) *Attorney, Agent, or Firm* — Morgan Lewis & Bockius LLP

(57) ABSTRACT

A display device and a method of manufacturing the same are provided. A display device includes: a substrate, a pixel circuit on the substrate, the pixel circuit including: a gate electrode, a drain electrode, and a source electrode, a vertical LED element on the substrate, the vertical LED element including: a first electrode, an active layer under the first electrode, and a second electrode under the active layer, an encapsulation film surrounding the vertical LED element, the encapsulation film exposing a portion of a side of the second electrode, a first connection electrode electrically connected to the first electrode, and a second connection electrode electrically connected to the second electrode.

9 Claims, 19 Drawing Sheets

(52) U.S. Cl.
CPC ............. *H01L 2933/005* (2013.01); *H01L 2933/0016* (2013.01); *H01L 2933/0066* (2013.01)

(58) Field of Classification Search
CPC .. H01L 33/54; H01L 21/0274; H01L 27/1214
USPC ......................................................... 257/79
See application file for complete search history.

(56) References Cited

U.S. PATENT DOCUMENTS

| | | |
|---|---|---|
| 2003/0189215 A1 | 10/2003 | Lee et al. |
| 2009/0184337 A1 | 7/2009 | Fan et al. |
| 2014/0367705 A1 | 12/2014 | Bibl et al. |
| 2015/0194392 A1 | 7/2015 | Kawata |
| 2016/0148916 A1 | 5/2016 | Higginson et al. |
| 2017/0062514 A1 | 3/2017 | Park |
| 2017/0294565 A1 | 10/2017 | Kim |
| 2018/0122836 A1 | 5/2018 | Kang et al. |
| 2018/0175268 A1 | 6/2018 | Moon et al. |
| 2019/0035817 A1 | 1/2019 | Park |

FOREIGN PATENT DOCUMENTS

| | | |
|---|---|---|
| EP | 3 316 301 A1 | 5/2018 |
| JP | 2006-308858 A | 11/2006 |
| JP | 2013-037138 A | 2/2013 |
| JP | 2013-251400 A | 12/2013 |
| JP | 2015-129830 A | 7/2015 |
| JP | 2016-122820 A | 7/2016 |
| JP | 2018-101785 A | 6/2018 |
| KR | 10-2017-0026954 A | 3/2017 |
| KR | 10-1718829 B1 | 4/2017 |
| KR | 10-2017-0116633 A | 10/2017 |
| KR | 10-2018-0063810 A | 6/2018 |
| KR | 10-2018-0078941 A | 7/2018 |
| KR | 10-1888857 B1 | 9/2018 |
| KR | 10-1902566 B1 | 9/2018 |

OTHER PUBLICATIONS

KIPO Preliminary Examination Report issued in connection with Korean Priority Application No. 10-2018-0146509, dated Apr. 16, 2019.
Extended European Search Report dated Feb. 28, 2020, issued in corresponding European Application No. 19197688.5.
Notice of Allowance dated Sep. 30, 2019, issued in corresponding Korean Patent Application No. 10-2018-0146509.
Notice of Reasons for Refusal dated Dec. 22, 2020, issued in corresponding Japanese Application No. 2019-209226.
Notice of Reasons for Refusal dated May 31, 2021, issued in corresponding Japanese Application No. 2019-209226.

* cited by examiner

DISPLAY DEVICE AND METHOD OF MANUFACTURING THE SAME

CROSS-REFERENCE TO RELATED APPLICATION(S)

This application claims the benefit of and priority to Korean Patent Application No. 10-2018-0146509, filed on Nov. 23, 2018, the entirety of which is hereby incorporated by reference.

BACKGROUND

1. Technical Field

The present disclosure relates to a display device and a method of manufacturing the same and, more particularly, to a display device using vertical light-emitting diodes (LEDs) and a method of manufacturing the display device.

2. Discussion of the Related Art

The application of a liquid crystal display device (LCD), an organic light-emitting display device (OLED), and a quantum dot display device (QD), which have been widely used recently, is gradually increasing. According to these display devices, a plurality of light-emitting elements is on a substrate of the display devices, and driving elements supplying driving signals or driving current to control the light-emitting element to individually emit light are also on the substrate together with the light-emitting element. Accordingly, the display devices analyze the light-emitting elements on the substrate in accordance with information to be displayed, such that the information is displayed on the substrate.

A liquid crystal display device is not a self-emitting type, so it requires a backlight unit, e.g., on the rear side of the liquid crystal display device to emit light. A backlight unit on the rear side of the liquid crystal display device increases the thickness of a liquid crystal display device, has a limit in implementing display devices in various designs, such as a flexible type or a circular shape, and may have deteriorated luminance and response speed.

Display devices with self-emitting elements can be implemented thinner than display devices with built-in light sources, so flexible and foldable display devices can be achieved. A display device with self-emitting elements may be classified into an organic light-emitting display device including an organic material as a light-emitting layer, an LED display device using LEDs as light-emitting elements, etc. Because self-emitting display devices, such as an organic light-emitting display device or an LED display device, do not need a separate light source, they can be used for thinner or various types of display devices.

However, problems, such as oxidation between an organic light-emitting layer and an electrode due to permeation of water and oxygen, easily occur in pixels in organic light-emitting display devices using an organic material, so various technological configurations for minimizing permeation of oxygen and water are additionally provided for organic light-emitting display devices. Recently, to solve these problems, research and development about a display device that uses LEDs using an inorganic material as light-emitting elements are in progress, and such a light-emitting display device is spotlighted as a next-generation display device because it has high image quality and high reliability.

SUMMARY

Accordingly, the present disclosure is directed to a display device and a method of manufacturing the same that substantially obviate one or more of the issues due to limitations and disadvantages of the related art.

An aspect of the present disclosure is to provide a display device including an LED element that may be installed in a panel in a short amount of time, and a method of manufacturing the display device.

Another aspect of the present disclosure is to provide a display device including an LED element, the device reducing a process cost that is generated for installing an LED in a panel, and a method of manufacturing the display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a substrate, a pixel circuit on the substrate, the pixel circuit including: a gate electrode, a drain electrode, and a source electrode, a vertical LED element on the substrate, the vertical LED element including: a first electrode, an active layer under the first electrode, and a second electrode under the active layer, an encapsulation film surrounding the vertical LED element, the encapsulation film exposing a portion of a side of the second electrode, a first connection electrode electrically connected to the first electrode, and a second connection electrode electrically connected to the second electrode.

In another aspect, there is provided a method of manufacturing a display device, the method including: providing a substrate including a pixel circuit, transferring a vertical LED element to the substrate including the pixel circuit, providing a second connection electrode on the vertical LED element, providing an insulating layer on the second connection electrode, and providing a first connection electrode on the insulating layer, wherein the first connection electrode is on and in electrical contact with a top surface of the vertical LED element, and wherein the second connection electrode is on and in electrical contact with an exposed portion of a side of a lower portion of the vertical LED element.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
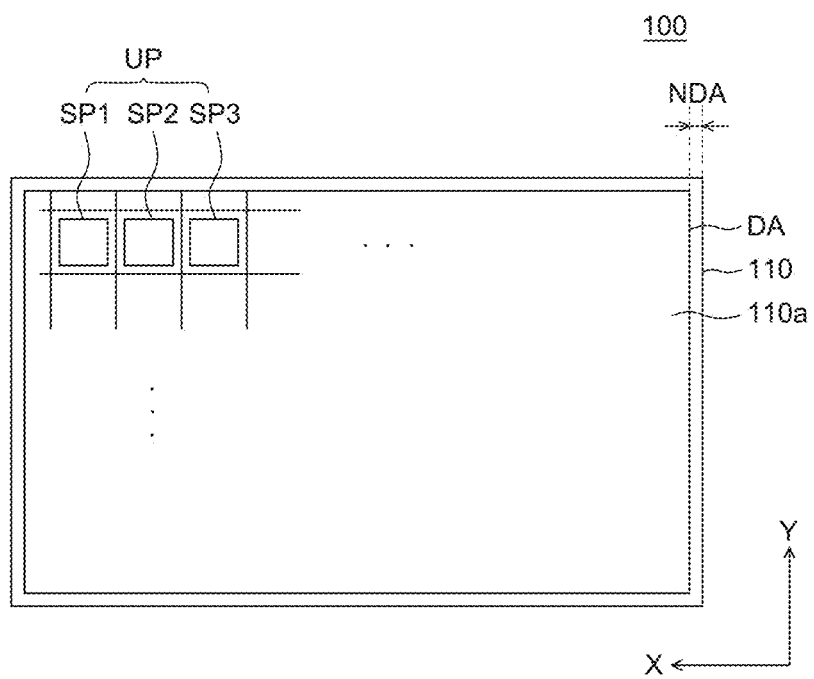
FIG. 1 is a plan view showing a display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. May be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the present disclosure, a gate driver on a substrate of a display panel may be implemented with an n-type or p-type transistor. For example, the transistor may be implemented with a transistor having a metal oxide semiconductor field effect transistor (MOSFET) structure. The transistor may be a three-electrode device, including a gate electrode, a source electrode, and a drain electrode. The source electrode may supply a carrier to the transistor. In the transistor, the carrier may start to move from the source. The drain electrode may be an electrode through which the carrier may move from the transistor to the outside.

For example, in the transistor, the carrier may move from the source electrode to the drain electrode. In an n-type transistor, because the carrier is an electron, a voltage of the source electrode is lower than a voltage of the drain electrode for the electron to move from the source electrode to the drain electrode. In the n-type transistor, because the electron moves from the source electrode to the drain electrode, a current moves from the drain electrode to the source electrode. In a p-type transistor, because the carrier is a hole, the voltage of the source electrode is higher than the voltage of the drain electrode for the hole to move from the source electrode to the drain electrode. In the p-type transistor, because the hole moves from the source electrode to the drain electrode, a current moves from the source electrode to the drain electrode. The source electrode and the drain electrode of the transistor may not be fixed, and may be switched in accordance with an applied voltage. Therefore, the source electrode and the drain electrode may respectively be referred to as a "first electrode" and a "second electrode" or the "second electrode" and the "first electrode."

Hereinafter, a gate-on voltage may be a voltage of a gate signal for turning on a transistor. A gate-off voltage may be a voltage for turning off the transistor. For example, in a p-type transistor, the gate on voltage may be a logic low voltage VL, and the gate off voltage may be a logic high voltage VH. In an n-type transistor, the gate on voltage may be a logic high voltage, and the gate off voltage may be a logic low voltage. Hereinafter, a gate driver and an electroluminescence display device using the same according to the present disclosure will be described with reference to the accompanying drawings.

LED elements, which are semiconductor light-emitting elements that emit light when a current is supplied to the semiconductor, are widely used in various display devices, such as a light, a television (TV), a signage display device, and a tiling display device. LED elements may include an n-type electrode, a p-type electrode, and an active layer between the electrodes. The n-type electrode and the p-type electrodes may include a semiconductor. When a current is supplied to the n-type electrode and the p-type electrode, electrons from the n-type electrode and holes from the p-type electrode may be coupled in an active layer, thereby emitting light.

LED elements may include a compound semiconductor, such as gallium nitride (GaN), so a high current can be supplied for the characteristics of an inorganic material. Accordingly, high luminance can be achieved. Further, LED elements may not be easily influenced by the external environment, such as heat, water, and oxygen, so they have high reliability.

Further, LED elements may have an internal quantum efficiency of about 90%, which is higher than that of organic light-emitting display devices, so they can display high-luminance images. Accordingly, a display device with low power consumption can be achieved.

Moreover, when an inorganic material is used, unlike an organic light-emitting display device, there is little influence by oxygen and water, so there may be no need for a separate encapsulation film or encapsulation substrate for minimizing permeation of oxygen and water. Accordingly, there may be the advantage of being able to reduce or minimize a non-display area of a display device that is a margin region that may be generated by disposing an encapsulation film or an encapsulation substrate.

However, light-emitting elements, such as an LED element, may use a process of forming the elements using a separate semiconductor substrate, and then installing the elements in a panel including a driving circuit. It may take a lot of time, and many errors may occur when installing a light-emitting element in a panel to provide an LED display device having these advantages, so there is a need for technologies that can reduce or even minimize these problems, and much research has been conducted in association with the technologies.

LED elements can be classified into a lateral LED element including an n-type electrode and a p-type electrode on the same surface thereof, and a vertical LED element including an n-type electrode and a p-type electrode facing each other. When installing a vertical LED element in a panel, the vertical LED element is transferred and electrically coupled to electrodes on the panel, so eutectic bonding (e.g., a mixture of substances, in fixed proportions, that melts and solidifies at a single temperature that is lower than the melting points of the separate constituents or of any other mixture of them) or an anisotropic conductive film (ACF) can be used. However, eutectic bonding requires a high-temperature process, e.g., over 300° C., so the process time may be delayed because it takes time to increase and decrease the temperature. Thus, this method may be difficult to apply to display devices requiring a large area and mass production. Similarly, the ACF also requires a high-temperature high-pressure process, so it may be difficult to apply to display devices requiring a large area and mass production, similar to the eutectic bonding. Further, the ACF contains precious metals, so the costs may be increased.

When installing a lateral LED element in a substrate, it may be possible to separately perform a transfer process that attaches the lateral LED element in a panel using a bonding layer and an electric connection process that uses photolithography, so the process time can be considerably reduced, as compared with eutectic bonding or a method using an ACF that can simultaneously perform physical bonding and electric connection. However, the lateral LED element increases in area up to double the vertical LED element having the same light-emitting area, so the material cost of the LED element may increase. Accordingly, the present inventor has invented, in consideration of the problems described above, a display device that can be provided with a large area, can be produced in large quantities, and can be manufactured at a lower cost than a lateral LED element having the same performance by separating the processes of transferring and electrically connecting an LED element without using eutectic bonding or an ACF.

Hereinafter, a display device and a method manufacturing the display device will be described in detail with reference to the accompanying drawings.

Figure 2:
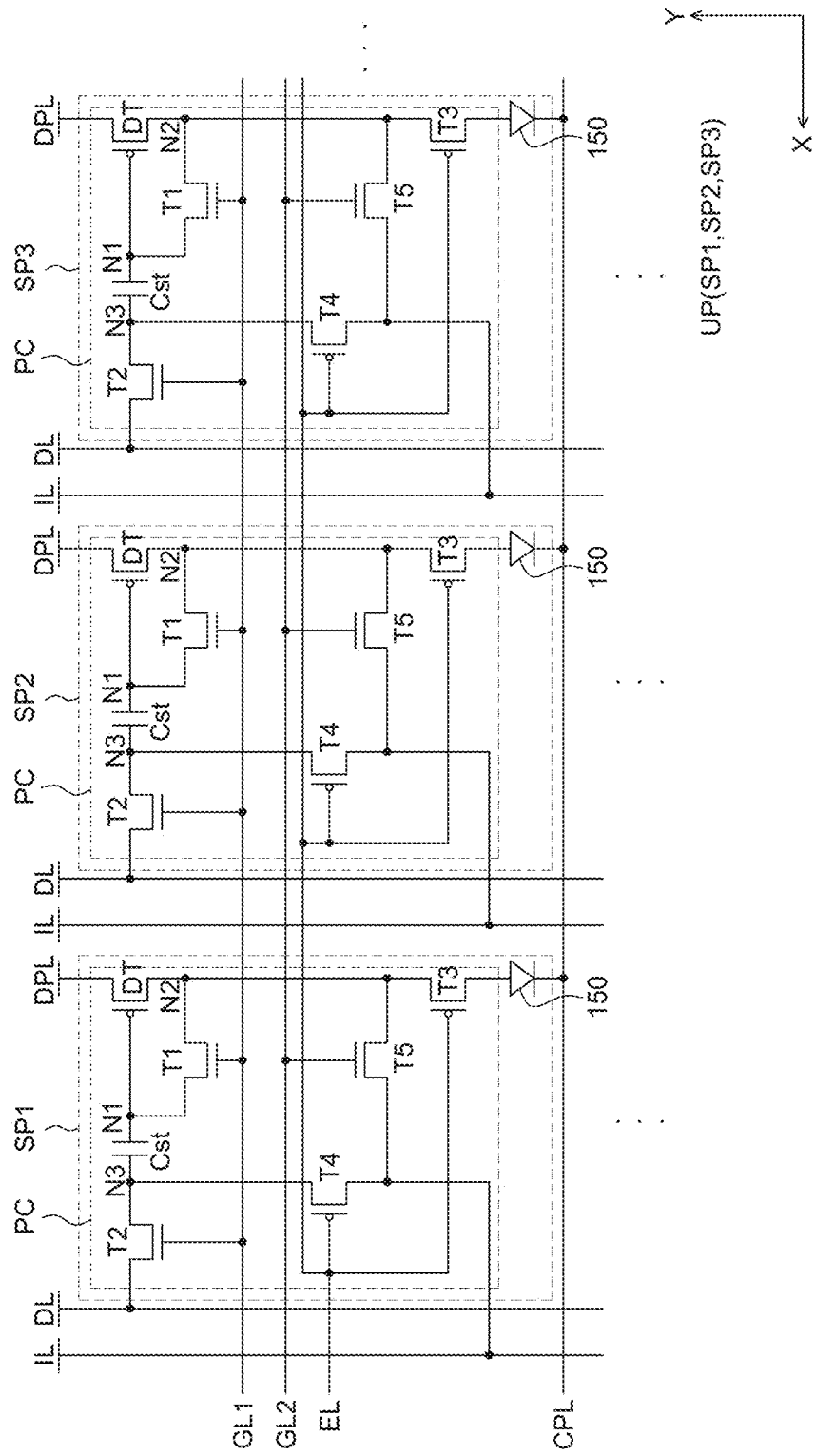
FIG. 2 is a circuit diagram illustrating a configuration of a unit pixel according to the example embodiment shown in FIG. 1.

FIG. 1 is a plan view showing a display device according to an example embodiment of the present disclosure. FIG. 2 is a circuit diagram illustrating a configuration of a unit pixel according to the example shown in FIG. 1.

With reference to FIGS. 1 and 2, a display device 100 according to an example embodiment of the present disclosure may include a substrate 110 divided into a display area DA, including a plurality of unit pixels UP, and a non-display area NDA. The unit pixels UP may each include a plurality of subpixels SP1, SP2, and SP3 on the front surface 110a of the substrate 110, and may generally include subpixels SP1, SP2, and SP3 that may emit red, blue, and green light. However, the unit pixels UP are not limited thereto, and may include subpixels emitting white light, etc.

The substrate 110, which is an array substrate with transistors thereon, may include a plastic material or a glass material. The substrate 110 according to an embodiment may include an opaque or colored polyimide material. For example, a back plate coupled to the rear side of the substrate 110 may be further included to keep the substrate 110 flat. The back plate according to an embodiment may include a plastic material, for example, a polyethylene terephthalate material. The substrate 110 according to an embodiment may be a glass substrate. For example, the substrate 110 including glass may be a thin glass substrate having a thickness of 100 µm or less, and may have a flexible characteristic. The substrate 110 may be divided into two or more substrates, or two or more layers that are bonded to each other.

The non-display area NDA may be defined as the area on the substrate 110, other than the display area DA, may have a width (or size) relatively smaller than the display area DA, and may be defined as the bezel area. The unit pixels UP may be in the display area DA. For example, the unit pixels UP may be in the display area DA such that they may each have a certain first reference pixel pitch in an x-axis direction and a certain second reference pixel pitch in a y-axis direction. The first reference pixel pitch and the second reference pixel pitch may be defined as the distances between the centers of adjacent unit pixels UP in the x-axis direction or y-axis direction. The distances between the subpixels SP1, SP2, and SP3 of the unit pixels UP, similar to the first reference pixel pitch and the second reference pixel pitch, may also be defined as a first reference subpixel pitch and a second reference subpixel pitch.

The width of the non-display area NDA may be smaller than the pixel pitch or the subpixel pitch in the display device 100 including the LED elements 150. For example, when the display device 100 including a non-display area NDA, including a length that is the same as or smaller than the pixel pitch or the subpixel pitch, is a tiling display device, the non-display area NDA may be smaller than the pixel pitch or the subpixel pitch, so a tiling display device substantially without a bezel area may be achieved.

To implement a tiling display device or a multi-screen display device having a reduced, substantially no bezel area, or a minimized bezel area, the first reference pixel pitch, the second reference pixel pitch, the first reference subpixel pitch, and the second reference subpixel pitch may be kept constant in the display area DA by the display device 100. However, it may be possible to further reduce the bezel area to be relatively smaller than the pixel pitches by defining the display area DA with a plurality of sections, making the lengths of the above pitches different in the sections, and making the pixel pitches of the sections adjacent to the non-display area NDA larger than those of the other sections. For example, the display device 100 having different pixel pitches may generate distortion in an image, so it may be possible to remove distortion in an image and reduce the bezel area by performing image processing using a method of comparing and sampling adjacent sections in consideration of the certain pixel pitches.

The configuration of the subpixels SP1, SP2, and SP3 constituting a unit pixel UP, and a driving circuit of the display device 100 are described with reference to FIG. 2. Pixel driving lines may be on the front surface 110a of the substrate 110 to supply driving signals to the subpixels SP1, SP2, and SP3. The pixel driving lines according to an example embodiment of the present disclosure may include gate lines GL, data lines DL, and power lines. The gate lines GL may include a first gate line GL1, a second gate line GL2, and an emission line EL. The power lines may include a driving power line DPL, a common power line CPL, and an initialization power line IL.

The gate lines GL may be on the front surface 110a of the substrate 110, may extend in a horizontal axis (e.g., x-axis) direction of the substrate 110, and may be spaced a certain distance apart from each other in a vertical axis (e.g., y-axis) direction. The data lines DL may cross the gate lines GL on the front surface 110a of the substrate 110, may extend in the vertical axis (e.g., y-axis) direction of the substrate 110, and may be spaced a certain distance apart from each other in the horizontal axis (e.g., x-axis) direction of the substrate 110.

The driving power lines DPL may be in parallel with the data lines DL on the substrate 110, and may be formed with the data lines DL. The driving power lines DPL may supply pixel driving power from the outside to adjacent subpixels SP1, SP2, and SP3. For example, one driving power line DPL may be provided for each of a plurality of unit pixels UP. For example, at least three subpixels, e.g., subpixels SP1, SP2, and SP3, of a unit pixel UP may share one driving power line DPL. Accordingly, it may be possible to reduce the number of power driving lines DPL for driving subpixels SP1, SP2, and SP3, and it may also be possible to increase the aperture ratios of the unit pixels UP or decrease the size of the unit pixels UP by the reduced number of power driving lines DPL.

The common power lines CPL may be in parallel with the gate lines GL on the substrate 110, and may be formed with the gate lines GL. The common power lines CPL may supply common power from the outside to adjacent subpixels SP1, SP2, and SP3.

The subpixels SP1, SP2, and SP3 may be respectively provided in subpixel areas defined by the gate lines GL and the data lines DL. The subpixels SP1, SP2, and SP3 may be defined as minimum units of areas from which light may actually be emitted.

Adjacent at least three subpixels SP1, SP2, and SP3 may constitute one unit pixel UP for displaying colors. For example, one unit pixel UP may include a red subpixel, e.g., subpixel SP1; a green subpixel, e.g., subpixel SP2; and a blue subpixel, e.g., subpixel SP3 that may be adjacent to each other in the horizontal axis (e.g., x-axis) direction, and may further include a white subpixel for improving luminance. The subpixels are shown in the drawings as being arranged in stripe shapes as an example, but embodiments are not limited thereto.

The subpixels SP1, SP2, and SP3, according to an example embodiment of the present disclosure, may each include a pixel circuit PC and an LED element 150. The pixel circuits PC may be in circuit areas defined in the subpixels SP1, SP2, and SP3, and may be respectively connected to adjacent gate lines GL, data lines DL, and power lines. The pixel circuits PC may control a current flowing through the LED elements 150 in accordance with data signals provided through the data lines DL in response to scan pulses provided through the gate lines GL based on pixel driving power provided through the driving power lines DPL. The pixel circuits PC, according to an example embodiment of the present disclosure, may each include a first transistor T1, a second transistor T2, a third transistor T3, a fourth transistor T4, a fifth transistor T5, a driving transistor DT, and a capacitor Cst. The first transistor T1 to the fifth transistor T5 and the driving transistor DT may be PMOS-type thin-film transistors, so they can secure a response characteristic. However, embodiments of the present disclosure are not limited thereto. For example, at least one of the first transistor T1 to the fifth transistor T5 and the driving transistor DT may be an NMOS-type thin-film transistor having a high off-current characteristic, and the other transistors may be PMOS-type thin-film transistors having a high response characteristic.

The LED element 150 may be mounted in each of the subpixels SP1, SP2, and SP3. The LED element 150 may be electrically connected to the pixel circuit PC and the common power line CPL of the corresponding subpixel, and the LED element 150 may emit light using the current flowing from the pixel circuit PC, e.g., from the driving transistor DT, to the common power line CPL. The LED element 150 according to an example embodiment of the present disclosure may be an optical element or a light-emitting diode chip that may emit light of any one of red light, green light, blue light, and white light. The light-emitting diode chip may have a scale of 1 to 100 micrometers (μm), but it is not limited thereto, and may have a size smaller than the other light-emitting area, except for a circuit area of the pixel circuit PC in the subpixel area.

The driving transistor DT may be a driving element that adjusts a current flowing through the LED element 150 in accordance with a gate-source voltage of the driving transistor DT. The driving transistor DT may include a gate electrode connected to a first node N1, a source electrode connected to a driving power line DPL, and a drain electrode connected to a second node N2.

The first transistor T1 may be connected between the first node N1 and the second node N2, and may be switched in response to a first gate signal. A gate electrode of the first transistor T1 may be connected to the first gate line GL1 to which a first gate signal may be applied. The first transistor T1 may connect the source electrode and the drain electrode of the driving transistor DT when it is turned on, thereby becoming a diode connection. For example, the first transistor T1 may sense and compensate for a threshold voltage factor of the driving transistor DT.

The second transistor T2 may be connected between a data line DL and a third node N3, and may be switched in response to a first gate signal. A gate electrode of the second transistor T2 may be connected to the first gate line GL1.

The second transistor T2 may apply a data signal to the third node N3 when it is turned on.

The third transistor T3 may be connected between the second node N2 and the LED element 150, and may be switched in response to an emission signal provided through the emission line EL. The third transistor T3 may provide the current flowing through the driving transistor DT to the LED element 150 when it is turned on. The third transistor T3 may control the LED element 150 having a low emission threshold voltage not to emit light due to an initialization voltage.

The fourth transistor T4 may be connected between the third node N3 and the initialization power line IL, and may be switched in response to an emission signal. The fourth transistor T4 may initialize the voltage at the third node N3 by providing initialization power provided through the initialization power line IL to the third node N3 when it is turned on.

The fifth transistor T5 may be connected between the second node N2 and the initialization power line IL, and may be switched in response to a second gate signal provided through the second gate line GL2. The fifth transistor T5 may initialize the voltage at the second node N2 by providing initialization power to the second node N2 when it is turned on.

The capacitor Cst may be in an overlapping area of the first node N1 and the third node N3, may store a voltage corresponding to a data signal supplied to the gate electrode of the driving transistor DT, and may turn on the driving transistor DT using the stored voltage.

Driving of the pixel circuit PC is described hereafter. Driving of a pixel circuit PC shown in FIG. 2 can be divided into a first initialization period, a second initialization period, a compensation period, a maintenance period, and an emission period. An emission signal and a second gate signal may have a gate-on voltage in the first initialization period, so the voltage at the third node N3 may be initialized, and the LED element 150 continue to emit light. In the second initialization period, the emission signal may be changed to have a gate-off voltage, a first gate signal may be changed to have a gate-on voltage, and the second gate signal may maintain a gate-on voltage, so the LED element 150 may stop emitting light, and a data signal may be applied to third node N3. In the compensation period, the second gate signal may be changed to have a gate-off voltage, and the first transistor T1 may be turned on, so the driving transistor DT may become a diode connection, and a process of compensating a threshold voltage may be performed. In the maintenance period, the first gate signal, second gate signal, and emission signal may all have the gate-off voltage, and the voltages that have been applied in the previous period may be maintained at the nodes. In the emission period, the emission signal may be changed to have the gate-on voltage, and the LED element 150 may emit light by a driving current provided from the driving transistor DT. For example, the initialization voltage may be a voltage lower than the driving voltage and higher than the common voltage. The driving current of the pixel circuit PC may not be influenced by the driving power, so it can achieve uniform image quality in a high-resolution display device.

The pixel circuit PC according to an example embodiment of the present disclosure may further include an auxiliary transistor and/or an auxiliary capacitor, etc. that may be controlled by a specific emission signal, in addition to the first transistor T1 to the fifth transistor T5, the driving transistor DT, and the capacitor Cst described above.

Figure 3:
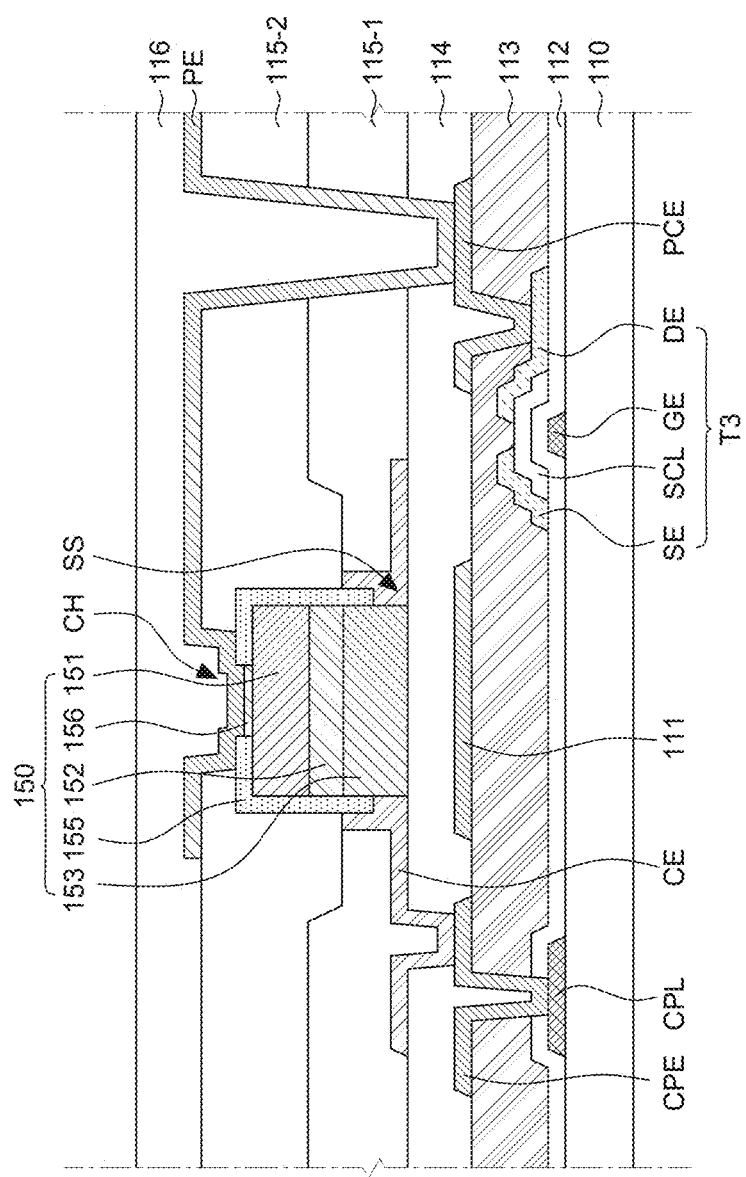
FIG. 3 is a cross-sectional view showing a display device having an LED element according to an example embodiment of the present disclosure.

FIG. 3 is a cross-sectional view showing a display device having an LED element according to an example embodiment of the present disclosure.

With reference to FIG. 3, the subpixels SP1, SP2, and SP3 of the display device 100 according to an example embodiment of the present disclosure may each include a pixel circuit PC, a protective layer 113, an LED element 150, an insulating layer 115-1 and 115-2, a pixel electrode PE, and a common electrode CE.

As described above with reference to FIG. 2, the pixel circuit PC may include a first transistor T1 to a fifth transistor T5, a driving transistor DT, and a capacitor Cst. The LED element 150 and the third transistor T3 connected to the LED element 150 of those components are mainly shown in FIG. 3 and described above, and duplicate description may be omitted. The third transistor T3 may include a gate electrode GE, a semiconductor layer SCL, a source electrode SE, and a drain electrode DE.

The gate electrode GE may include the same material on the same layer as the gate line GL on the substrate 110, and may be covered with a gate insulating layer 112. The gate electrode GE may include a semiconductor, such as silicon (Si), or any conductive metal, such as molybdenum (Mo), aluminum (Al), chromium (Cr), gold (Au), titanium (Ti), nickel (Ni), neodymium (Nd), and copper (Cu), an alloy of two or more metals, or may be a multi-layer including the above. The gate insulating layer 112 may be a single layer or a multi-layer including an inorganic material, and may include a silicon oxide ($SiO_x$), a silicon nitride ($SiN_x$), etc. The gate electrode of the third transistor T3 may diverge or protrude from the emission line EL.

The semiconductor layer SCL may be provided in a certain pattern on the gate insulating layer 112 to overlap the gate electrode GE. The semiconductor layer SCL may include a semiconductor material that may be one or more of: amorphous silicon, polycrystalline silicon, an oxide, and an organic material, but is not limited thereto. The source electrode SE may overlap a portion of the semiconductor layer SCL, and may include the same material on the same layer as the data line DL and the driving power line DPL. The drain electrode DE may overlap the other portion of the semiconductor layer SCL, apart from the source electrode SE, and may include the same material on the same layer as the source electrode SE. The source electrode SE and the drain electrode DE may include a semiconductor, such as silicon (Si), or any conductive metal, such as molybdenum (Mo), aluminum (Al), chromium (Cr), gold (Au), titanium (Ti), nickel (Ni), neodymium (Nd), and copper (Cu), an alloy of two or more metals, or may be a multi-layer of the above.

The protective layer 113 may be provided throughout the front surface of the substrate 110 to cover the pixel circuit PC. The protective layer 113 can provide a flat surface while protecting the pixel circuit PC. The protective layer 113 according to an example embodiment of the present disclosure may include an organic material, such as benzocyclobutene or photoacryl. The protective layer 113 may have a separate protective layer, that may protect the pixel circuit PC, and a planarization layer, that may flatten the pixel circuit PC with steps.

The LED element 150 may be electrically connected to the pixel circuit PC and the common power line CPL, and may emit light using the current flowing from the pixel circuit PC to the common power line CPL. The LED element 150 according to an example embodiment of the present disclosure may include a first electrode 151, an active layer 152, a second electrode 153, an encapsulation film 155, and an auxiliary electrode 156. In the LED element 150 according to an example embodiment of the present disclosure, the first electrode 151 may be a p-type electrode that may be an anode terminal, while the second electrode 153 may be an n-type electrode that may be a cathode terminal. The LED element 150 may emit light using re-coupling of electrons and holes due to a current flowing between the first electrode 151 and the second electrode 153. The LED element 150 will be described with reference to FIG. 4.

The LED element 150 according to an example embodiment of the present disclosure may be disposed on the protective layer 113 by an adhesive member 114. Alternatively, though not shown in the drawings, it may be possible to form a recession on the protective layer 113, and the LED element 150 may be disposed in the recession. For example, the inclined surface of the recession on the protective layer 113 may make light from the LED element 150 travel in a particular direction, and light emission efficiency can be improved.

The insulating layers 115-1 and 115-2 may be formed on the protective layer 113 to cover the LED element 150. The insulating layers 115-1 and 115-2 may be on the protective layer 113, having a thickness that can cover all of: the front surface of the protective layer 113, the portion where the LED element 150 is disposed, and the other front surface. The insulating layers 115-1 and 115-2 may be a multi-planarization layer, including a first insulating layer 115-1 and second insulating layer 115-2. The insulating layers 115-1 and 115-2 may provide a flat surface on the protective layer 113, and may fix the position of the LED element 150.

A pixel electrode PE may connect the first electrode 151 of the LED element 150 to the drain electrode DE of the third transistor T3. The pixel electrode PE may extend into an auxiliary contact hole CH to contact the auxiliary electrode 156. For example, the first electrode 151 of the LED element 150 may be connected to the source electrode SE of the third transistor T3. The pixel electrode PE connected to the first electrode 151 of the LED element 150 may be defined as an "anode" or a "first connection electrode." The pixel electrode PE may be on the insulating layers 115-1 and 115-2, and may be in contact with a pixel connection electrode PCE, which may be connected to the drain electrode DE, through the insulating layers 115-1 and 115-2 and the adhesive member 114. The pixel connection electrode PCE may be on the protective layer 113, and may be in contact with the drain electrode DE of the third transistor T3 through a contact hole penetrating through the protective layer 113. The pixel electrode PE may include a transparent conductive material when the display device 100 is a top-emission type, and may include a light reflex conductive material when the display device 100 is a bottom-emission type. The transparent conductive material may be an indium tin oxide (ITO) or an indium zinc oxide (IZO), etc., but is not limited thereto. The light reflex conductive material may be Al, silver (Ag), Au, platinum (Pt), Cu, etc., but is not limited thereto. The pixel electrode PE, including a light reflex conductive material, may be a single layer including the light reflex conductive material, or may be a multi-layer formed by stacking the signal layers.

The common electrode CE, which may electrically connect the second electrode 153 of the LED element 150 and the common power line CPL, may be defined as a "cathode" or a "second connection electrode," and may include the same material as the pixel electrode PE. The common electrode CE may be on the adhesive member 114 in contact with a side portion SS of the second electrode 153 of the LED element 150, and may be connected to the common power line CPL through a common connection electrode CPE. The common power line CPL may be between the substrate 110 and the gate insulating layer 112. The common connection electrode CPE may be on the protective layer 113, and may include the same material on the same layer as a pixel connection electrode PCE. The common connection electrode CPE may be in contact with the common power line CPL through contact holes penetrating through the protective layer 113 and the gate insulating layer 112. The common electrode CE may be in contact with the common connection electrode CPE through a contact hole penetrating through the adhesive member 114. For example, the position of the common power line CPL is not limited to the position between the substrate 110 and the gate insulating layer 112. The common power line CPL may include the same material on the same layer as the gate electrode GE, or the source electrode SE and the drain electrode DE of the third transistor T3 under the protective layer 113. Accordingly, the common power line CPL may be between the gate insulating layer 112 and the protective layer 113.

The display device 100 according to an example embodiment of the present disclosure may include a reflective layer 111 under the emission areas of the subpixels. The reflective layer 111 may be on the substrate 110, and may overlap emission areas, including the LED element 150. The reflective layer 111 may include the same material on the same layer as the pixel connection electrode PCE and the common connection electrode CPE, but is not limited thereto. The reflective layer 111 may include the same material as one of the electrodes of the third transistor T3. The reflective layer 111 can increase luminance efficiency of the display device 100 by reflecting light coming from the LED element 150 over the LED element 150. Accordingly, the display device 100 according to an example embodiment of the present disclosure may have a top-emission structure by including the reflective layer 111. For example, the pixel electrode PE may include a transparent conductive material, and the pixel connection electrode PCE and the reflective layer 111 may include a light reflex conductive material. On the other hand, when the display device 100 according to an example embodiment of the present disclosure is a bottom-emission type, the reflective layer 111 may not be provided, or may be over the LED element 150.

Figure 4:
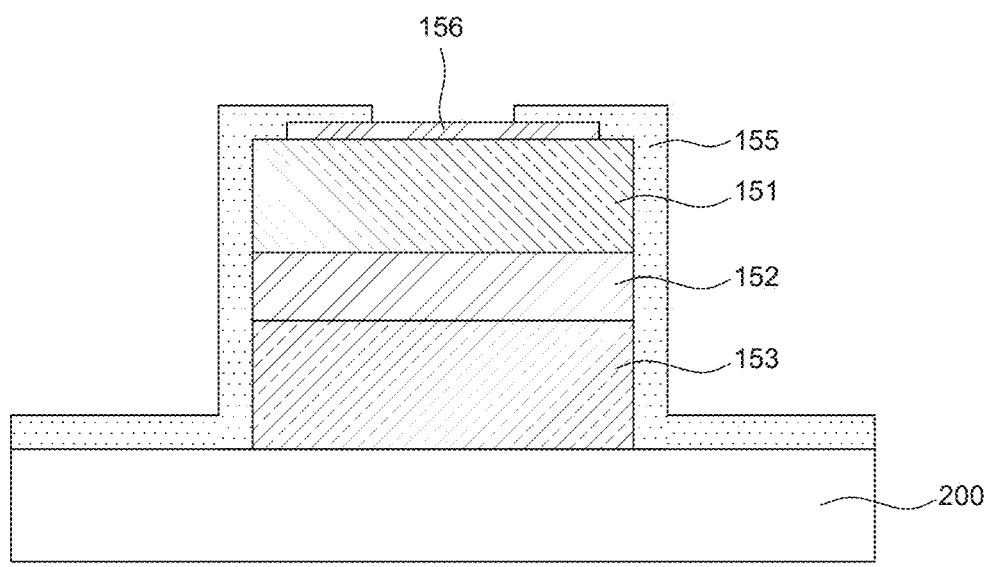
FIG. 4 is a cross-sectional view showing an LED element according to an example embodiment of the present disclosure.

FIG. 4 is a cross-sectional view showing an LED element according to an example embodiment of the present disclosure.

FIG. 4 is a view showing the LED element 150 on a growth substrate 200 before being installed in a panel. The LED element 150 may be a p-n junction structure having a second electrode 153, an active layer 152, and a first electrode 151 sequentially formed on the growth substrate 200.

The growth substrate 200 may be a sapphire substrate, or may be a substrate having gallium nitride (GaN), gallium arsenide (GaAs), and Si as a base, and an n-type semiconductor layer, an active layer 152, and a p-type semiconductor layer may be sequentially formed on the growth substrate 200, e.g., by a chemical growth method. For example, the n-type semiconductor layer may be the second electrode 153, and the p-type semiconductor layer may be the first electrode 151.

The n-type semiconductor layer, may be is a semiconductor layer in which a current is generated by movement of free electrodes having a negative charge as carriers, may include an n-GaN-based material. The n-GaN-based material may be GaN, aluminum gallium nitride (AlGaN), indium gallium nitride (InGaN), aluminum indium gallium nitride (AlInGaN), etc., and Si, germanium (Ge), selenium (Se), tellurium (Te), carbon (C), etc. may be used as an impurity for doping the n-type semiconductor layer. For example, a buffer layer, such as a non-doped GaN-based semiconductor layer may be additionally provided between the growth substrate 200 and the n-type semiconductor layer.

The active layer 152 may be on the n-type semiconductor layer, and may have a multi-quantum well (MQW) structure having a well layer and a barrier layer having a higher band gap than the well layer. For example, the active layer 152 may have an MQW structure of InGaN/GaN, etc.

The p-type semiconductor layer, which is a semiconductor layer in which a current may be generated by movement of holes having a positive charge as carriers, may include a p-GaN-based material. The p-GaN-based material may be GaN, AlGaN, InGaN, AlInGaN, etc., and magnesium (Mg), zinc (Zn), beryllium (Be), etc. may be used as an impurity for doping the p-type semiconductor layer.

An auxiliary electrode 156 may be on the p-type semiconductor to form ohmic contact. The LED element 150 may to be installed in a panel, and may be connected to the pixel electrode PE, so the auxiliary electrode 156 can be supplied with a voltage corresponding to a data voltage through the third transistor T3 in contact with the pixel electrode PE. In the top-emission type display device according to an example embodiment of the present disclosure, the auxiliary electrode 156 may include a transparent conductive material, such as an ITO or an IZO, but is not limited thereto.

An encapsulation film 155 may be on the auxiliary electrode 156 to protect the structure including the n-type semiconductor layer, the active layer 152, and the p-type semiconductor layer. The encapsulation film 155 may be on the top of the p-type semiconductor layer and the front surfaces of the auxiliary electrode 156 and the growth substrate 200, and may have an opening that exposes a portion of the auxiliary electrode 156 to bring the pixel electrode DE and the auxiliary electrode 156 in contact with each other. The encapsulation film 155 may include any one of: silicon dioxide ($SiO_2$), silicon nitride ($Si_3N_4$), and resin, or may include at least one oxide formed with one or more of: nickel (Ni), titanium (Ti), Pt, lead (Pd), Cu, copper-tungsten (CuW), Mo, molybdenum-tungsten (MoW), Ag, and Al.

When the LED element 150 formed on the growth substrate 200 is installed on a panel, the auxiliary electrode 156 may be connected to the pixel electrode PE through the opening of the encapsulation film 155. Accordingly, a positive voltage may be applied to the p-type semiconductor layer through the pixel electrode PE, and a negative voltage may be applied to the n-type semiconductor layer through the common electrode CE. Therefore, current may flow between the pixel electrode PE and the common electrode CE by movement of electrons in the n-type semiconductor layer, and by flow of holes in the p-type semiconductor layer. The electrons and holes may be re-coupled by the current flowing between the pixel electrode PE and the common electrode CE, and light may be emitted from the active layer 152.

A process of installing the LED element 150 on the growth substrate 200 in a panel is described hereafter.

FIGS. 5A to 5J are cross-sectional views showing a method of installing an LED element in a panel according to an example embodiment of the present disclosure.

As described above, a vertical LED may be transferred the vertical LED element, and may be electrically coupled to electrodes on the panel, so eutectic bonding or an anisotrophic conductive film (ACF) can be used. However, eutectic bonding requires a high-temperature process over 300° C., so the process time may be delayed because it takes time to increase and decrease the temperature. Thus, this method may be difficult to apply to display devices having a large area and mass production. Similarly, the ACF also requires a high-temperature high-pressure process, so it may be difficult to apply to display devices having a large area and mass production, similar to the eutectic bonding. Further, the ACF contains precious metals, so the costs may also increase. Further, the lateral LED element may increase in area up to double the vertical LED element having the same light-emitting area, so the material cost of the LED element may increase. Accordingly, a method of manufacturing a display device at relatively low cost for a relatively short process time using a vertical LED element is described hereafter.

Figure 5A:
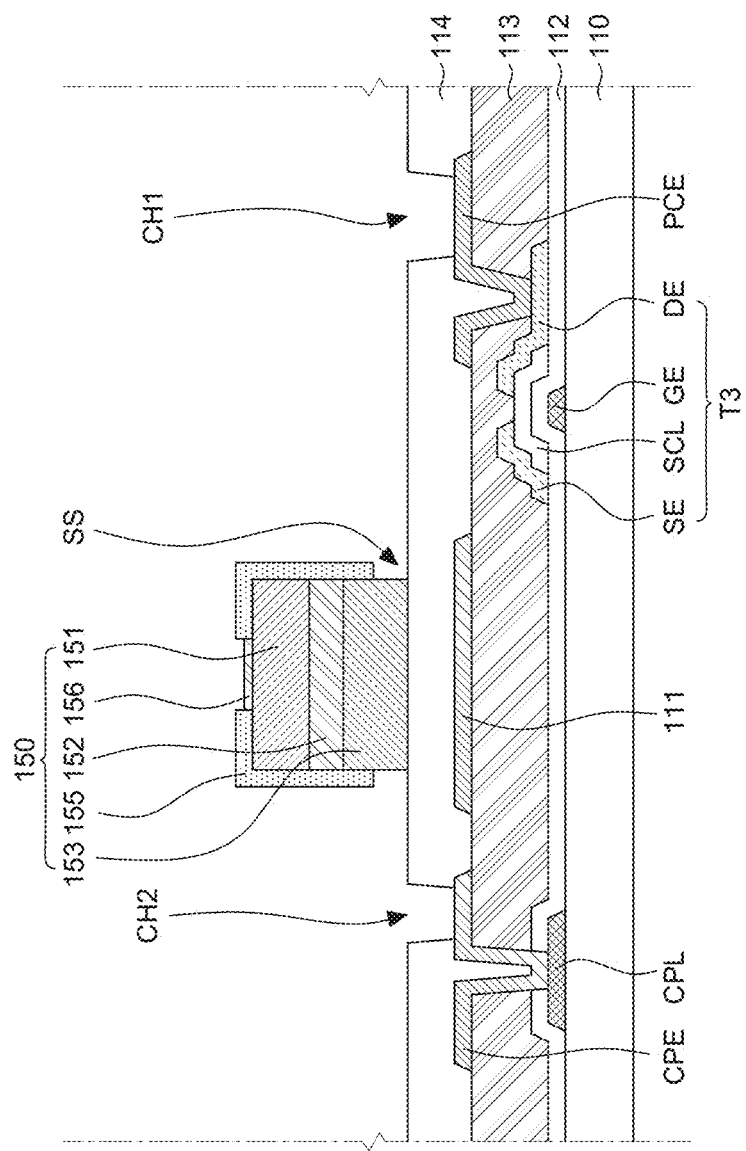
FIGS. 5A to 5J are cross-sectional views showing a method of installing an LED element in a panel according to an example embodiment of the present disclosure.

FIG. 5A is a view showing a process of transferring the LED element 150 to a panel, in which an adhesive member 114 for transferring the LED element 150 may be formed on the substrate 110 including the pixel circuit PC, the protective layer 113 covering the pixel circuit PC, the pixel connection electrode PCE, and the common connection electrode CPE. The adhesive member 114 may be coated with a uniform thickness on the entire front surface of the protective layer 113, and portions of the adhesive member 114 coated on the entire front surface of the protective layer 113 may be removed to form contact holes CH1 and CH2 by the contact hole forming process. Alternatively, the adhesive member 114 may be applied on the protective layer 133, except for the areas where the contact holes CH1 and CH2 may be formed, through printing, such as ink jetting.

A substrate separation process that separates the LED element 150 from the growth substrate 200 may be performed to transfer the LED element 150 to the adhesive member 114. The substrate separation process may include laser lift-off (LLO), chemical lift off (CLO), or a method of breaking an encapsulation film by applying pressure with a stamp. In the substrate separation process, the LED element 150 may be separated from the growth substrate 200, and a portion of the encapsulation film 155 covering the second electrode 153 adjacent to the growth substrate 200 may be removed along with the growth substrate 200, e.g., to simplify and/or facilitate subsequent electrical connection to the second electrode 153. Accordingly, a side portion SS of the second electrode 153 may be exposed and not covered by the encapsulation film 155. For example, the exposed side portion SS of the second electrode 153 may be limited to the portion under the active layer 152, so it may be possible to suppress an unnecessary voltage being applied to the active layer 152. A laser, chemical substances, or physical pressure, etc. used for the substrate separation process, may only have to have an intensity (or amount) that can separate the growth substrate 200 from the LED element, so the entire encapsulation film 155 may not be removed in the substrate separation process. For example, the encapsulation film 155 may completely surround the first electrode 151 and the active layer 152, and may partially surround the second electrode.

The LED element 150 separated from the growth substrate 200, with the side portion SS and bottom of the second electrode 153 exposed, may be disposed on the adhesive member 114 to overlap the reflective layer 111. The adhesive member 114 can primarily fix the LED element 150 to the panel in contact with the bottom of the LED element 150.

Such a simple bonding method can remarkably reduce the time for the transferring process.

A process of electrically connecting the LED element 150 to the pixel circuit PC is described hereafter.

Figure 5B:
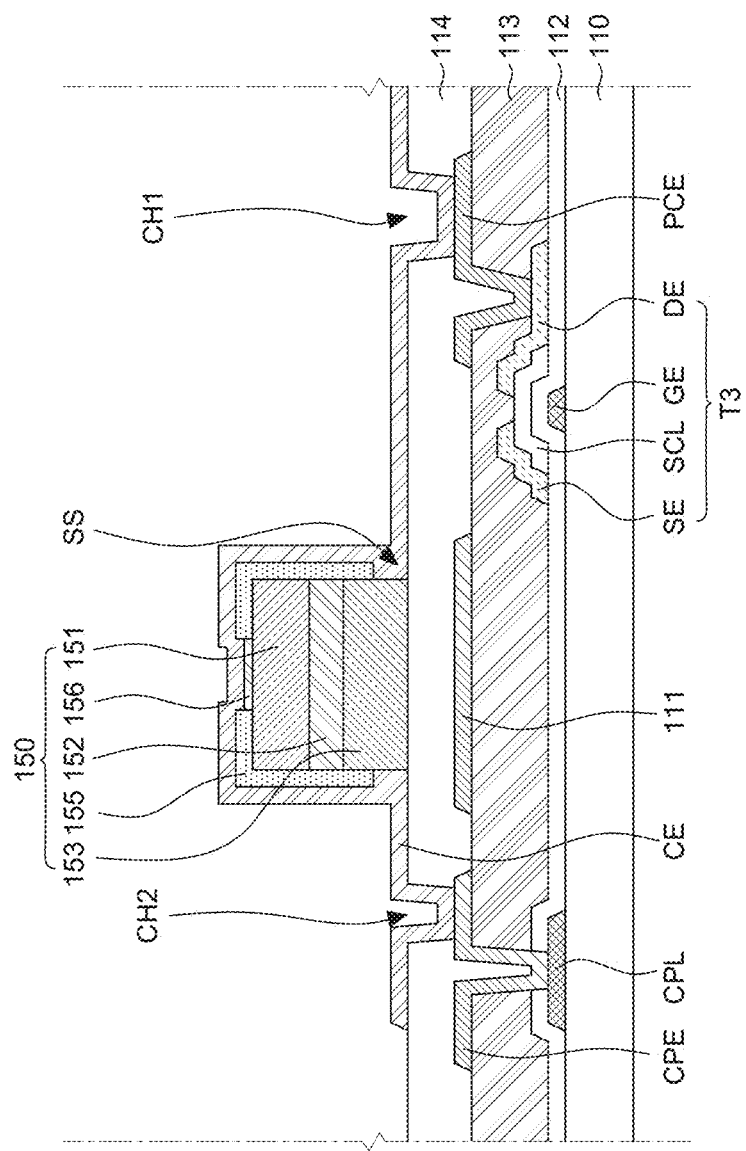

With reference to FIG. 5B, a common electrode CE may be formed on the LED element 150 attached to the panel through the adhesive member 114 and on the front surface of the substrate 110. The common electrode CE may be formed in contact with all of the auxiliary electrode 156 of the LED element 150, the side portion SS of the second electrode 153, and the contact holes CH1 and CH2.

Figure 5C:
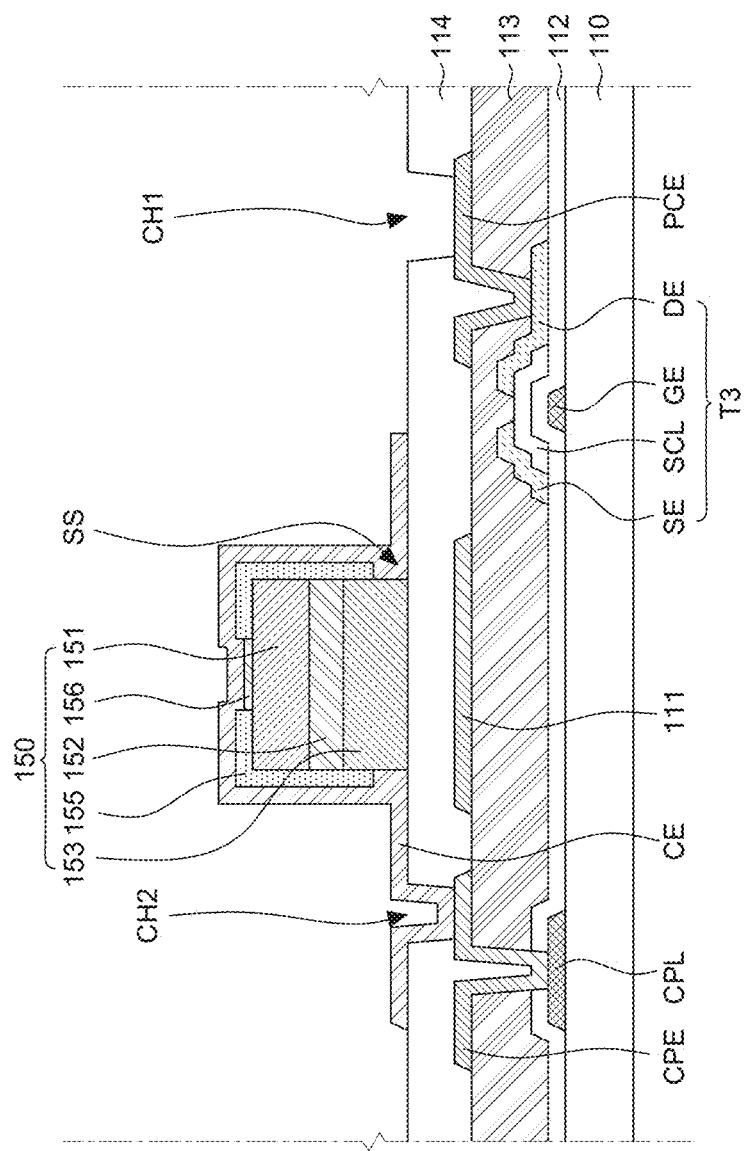

With reference to FIG. 5C, the common electrode CE may be an electrode for providing common power applied through the common power line CPL to the second electrode 153, so patterning for removing the common electrode CE covering the first contact hole CH1 formed on the pixel connection electrode PCE may be performed. Accordingly, the pixel connection electrode PCE formed at the first contact hole CH1 may be exposed to the air, and the common electrode CE may be in contact with the side portion SS of the second electrode 153 and the common power line CPL, thereby electrically connecting the second electrode 153 and the common power line CPL to each other. Accordingly, the common electrode CE also being in contact with the auxiliary electrode 156 may be removed, so patterning that is performed on the common electrode CE to open the top of the auxiliary electrode 156 is described hereafter.

The common electrode CE may have a sealing structure covering the entire side portion SS of the LED element 150, with only the top of the LED element 150 exposed, or may have a structure covering the side portion SS of the second electrode 153, with a small or a minimum area for connection with the common connection electrode CPE. The structure in which the common electrode CE according to an example embodiment of the present disclosure surrounds the entire side portion SS of the LED element 150 with only the top of the LED element 150 exposed is described. The encapsulation film 155, which may be removed when the LED element 150 is separated from the growth substrate 200, may not expose the side portion SS of the second electrode 153 with a uniform height. Accordingly, the common electrode CE may be formed to surround the entire side portion SS of the LED element 150, rather than partially surround the side portion SS, whereby it may be advantageous in electric connection with the common power line CPL.

Figure 5D:
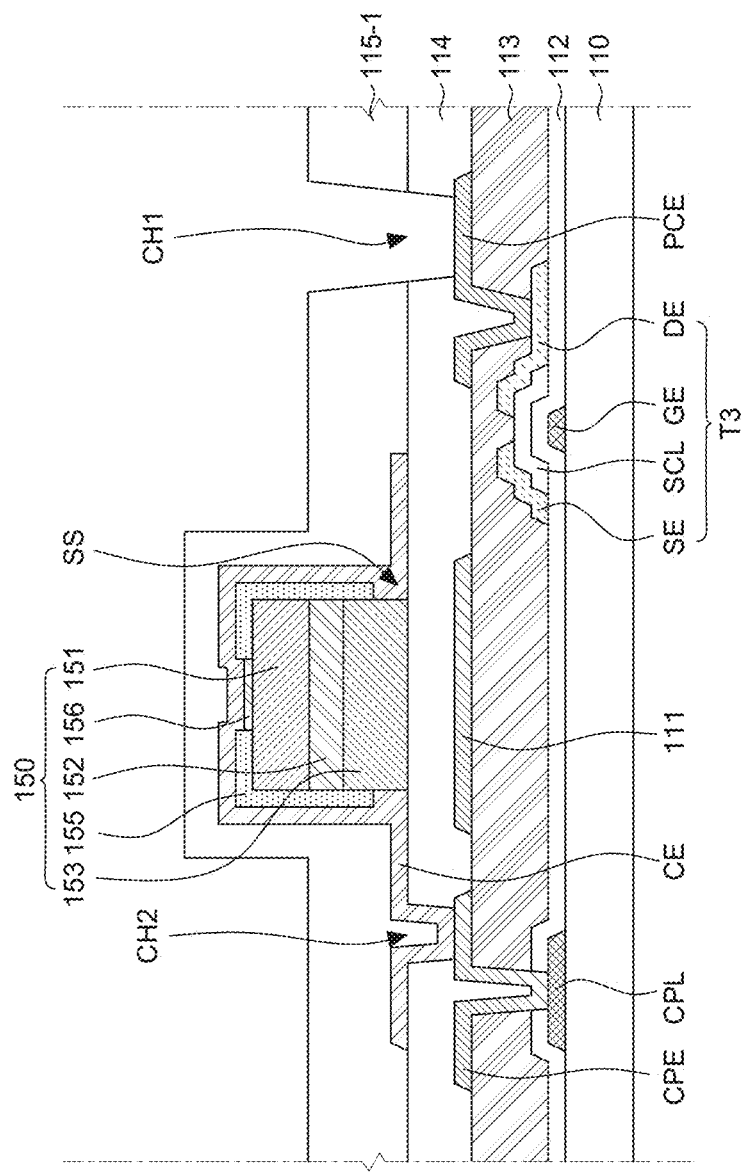

FIG. 5D shows the state in which the first insulating layer 115-1 has been patterned on the substrate 110. The first insulating layer 115-1 may be formed by depositing on the LED element 150, the common electrode CE, and the front surface of the substrate 110, and by removing the first insulating layer 115-1 on the first contact hole CH1 using photolithography. The first insulating layer 115-1 may have a thickness smaller than the height of the LED element 150 so that the top of the LED element 150 can be exposed in the following process.

Figure 5E:
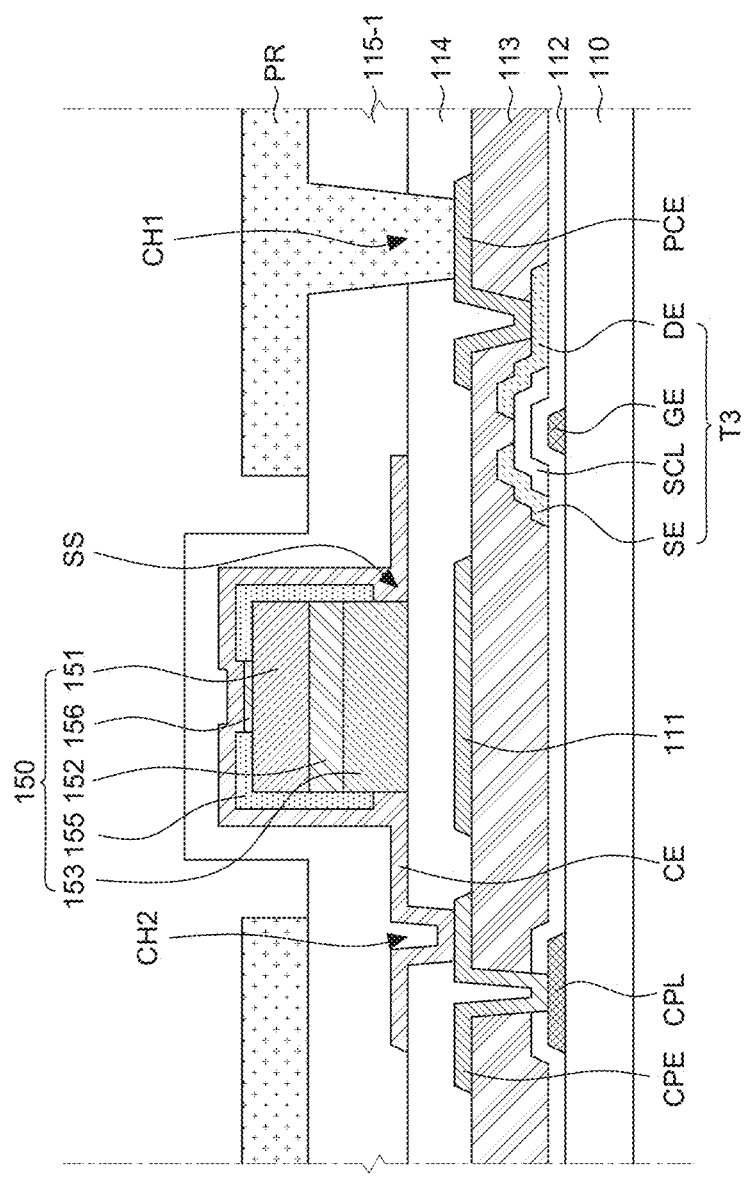
Figure 5F:
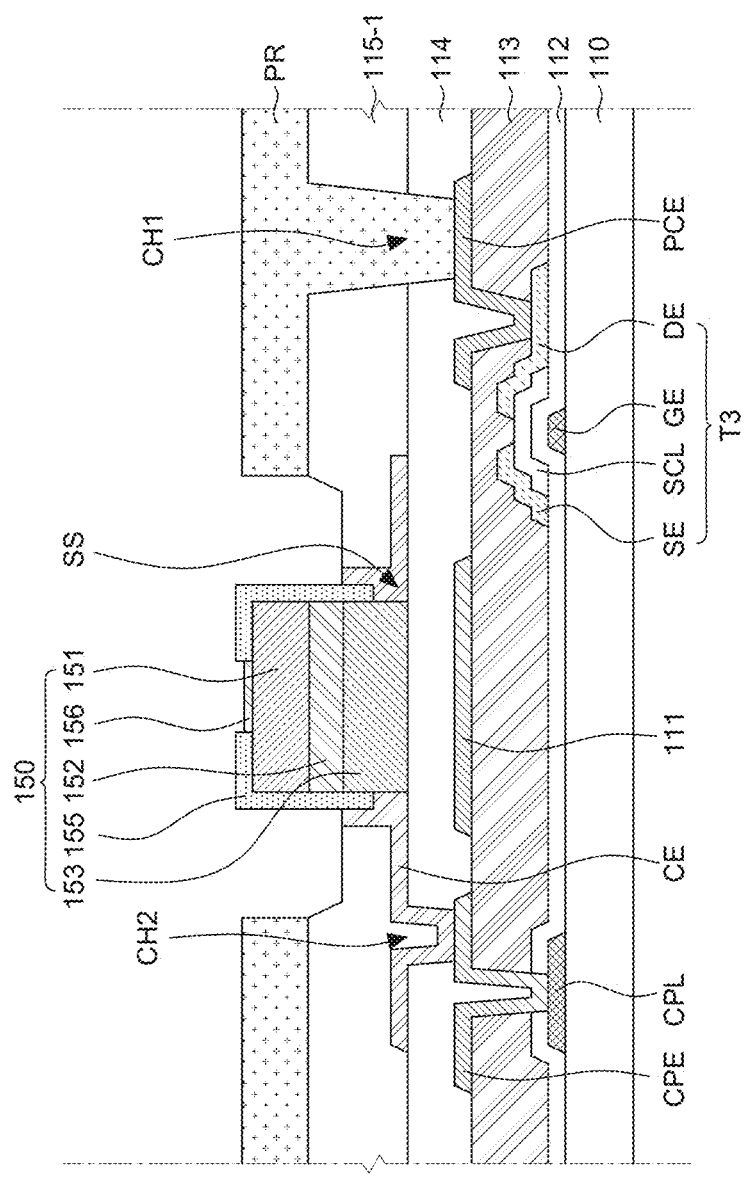
Figure 5G:
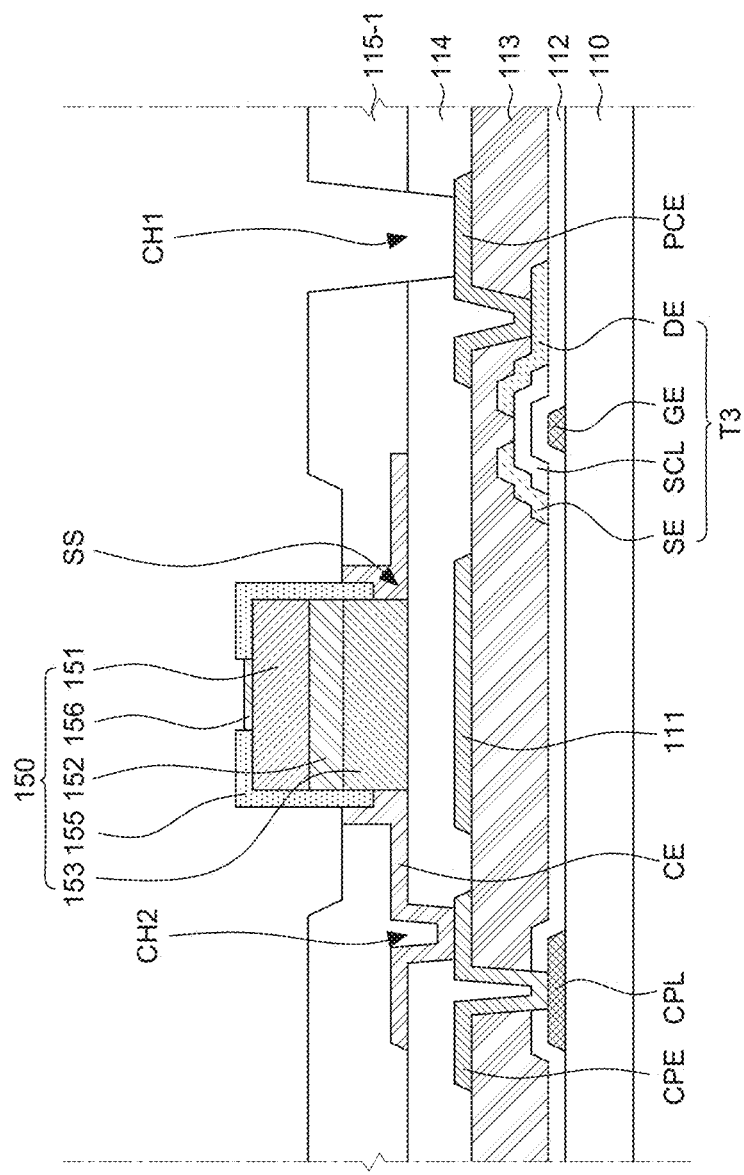

FIGS. 5E to 5G show removing the common electrode CE and the first insulating layer 115-1 to expose the top of the LED element 150. With reference to FIG. 5E, a photoresist (PR) may be applied to an area on the first insulating layer 115-1, except for the LED element 150 and a certain portion around the LED element 150. With reference to FIG. 5F, the first insulating layer 115-1 and the common electrode CE in the area without the photoresist applied thereon may be removed, with only a certain thickness left by dry etching, thereby exposing the auxiliary electrode 156. For example, the first insulating layer 115-1 on the common electrode CE may also be removed, so a portion of the common electrode CE may be exposed to the air. The first insulating layer 115-1 and the common electrode CE may be etched such that the second electrode 153 of the LED element 150 may not be exposed. With reference to FIG. 5G, the photoresist may be removed, e.g., by a strip solution.

Figure 5H:
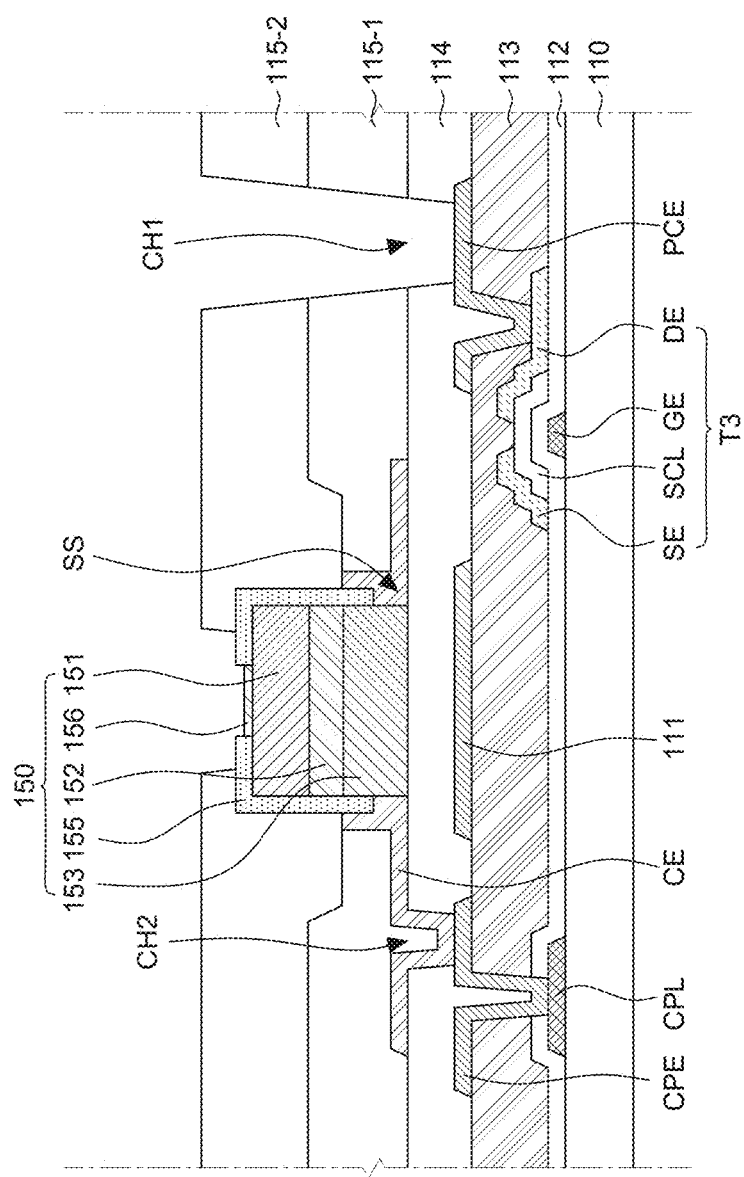

FIG. 5H shows the state in which the second insulating layer 115-2 has been patterned on the substrate 110. The second insulating layer 115-2 may be formed by depositing on the LED element 150 and the front surface of the substrate 110, and by removing the second insulating layer 115-2 on the first contact hole CH1 and the auxiliary electrode 156. The second insulating layer 115-2 may be formed higher than the LED element 150 to cover the common electrode CE exposed to the air, e.g., to suppress a short between the common electrode CE and the auxiliary electrode 156. The second insulating layer 115-2 on the first contact hole CH1 and the auxiliary electrode 156 on the LED element 150 may be removed by photolithography.

Figure 5I:
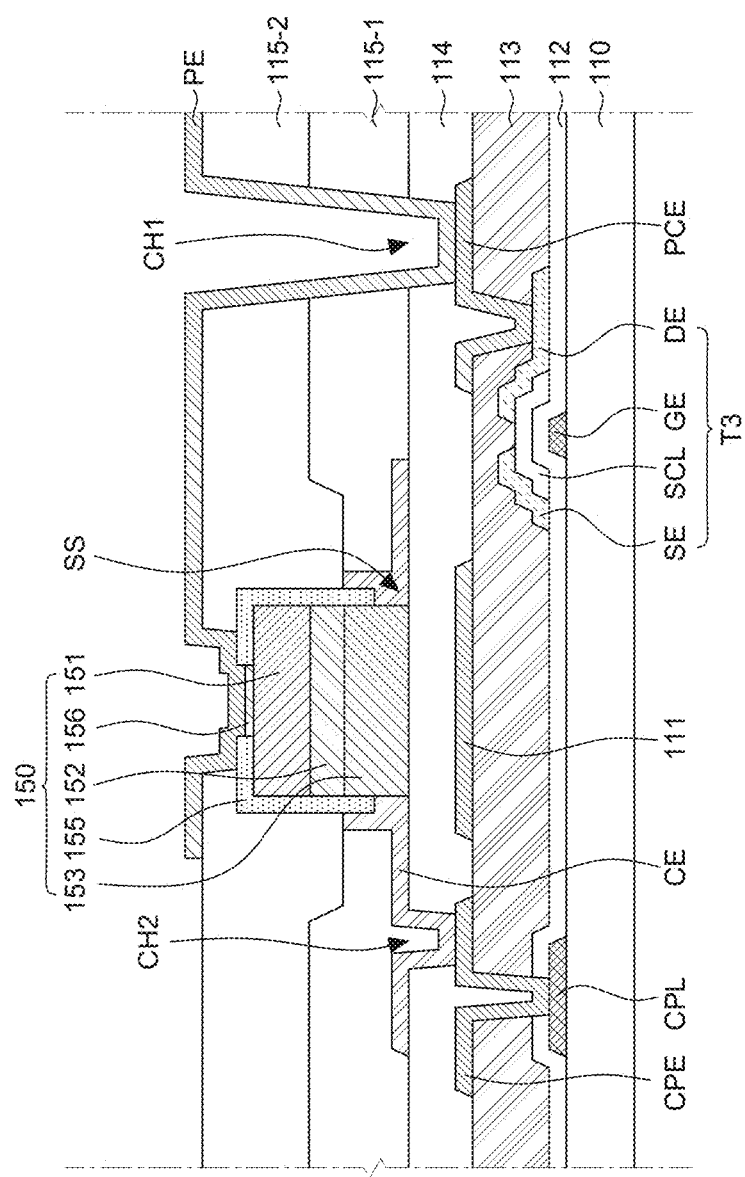

With reference to FIG. 5I, a pixel electrode PE, which may be an electrode for providing a voltage applied through the drain electrode DE of the third transistor T3 to the first electrode 151, may be formed on the substrate 110, including the first contact hole CH1 on the pixel connection electrode PCE and on the top of the LED element 150 that may be exposed by the second insulating layer 115-2. Patterning for removing the portions of the pixel electrode PE, which may be formed in areas other than the portion for electrically connecting the auxiliary electrode 156 and the pixel connection electrode PCE, may be performed. Accordingly, a pixel electrode PE insulated from adjacent subpixels can be formed.

Figure 5J:
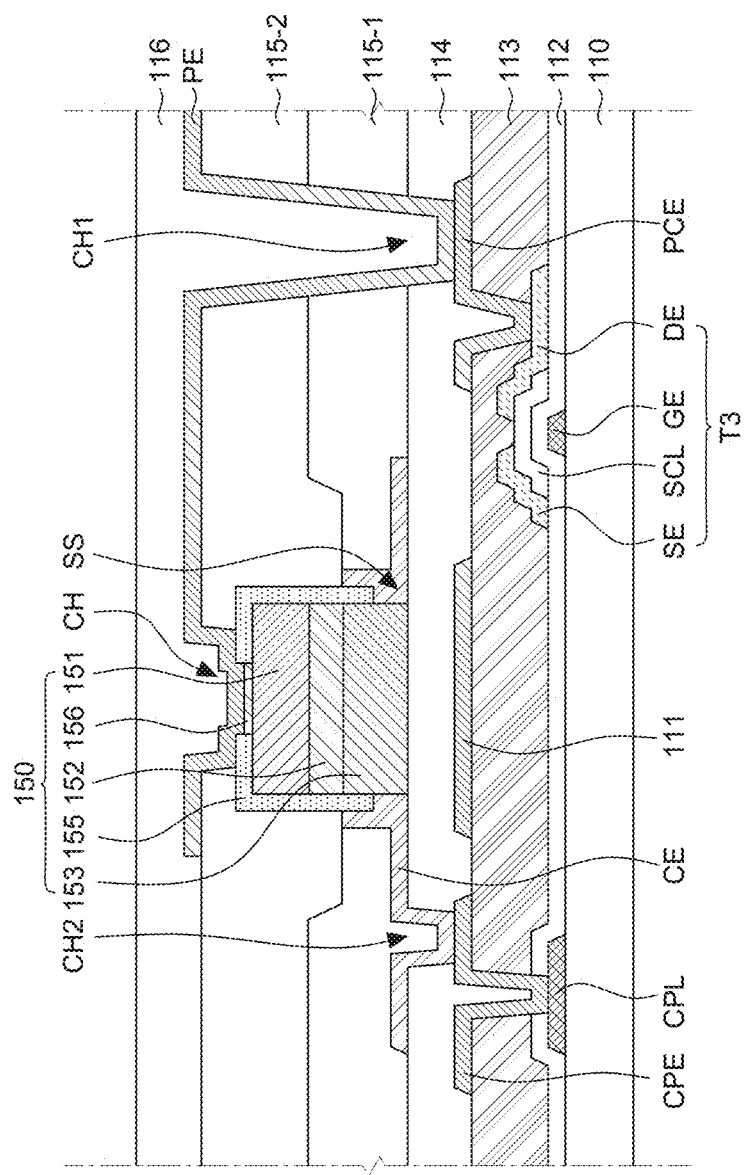

With reference to FIG. 5J, the display device may further include a buffer layer 116 on the front surface of the substrate 110. The buffer layer 116 may be disposed on the substrate 110 to cover the entire insulating layer 115-1 and 115-2 having the pixel electrode PE, thereby providing a flat surface on the insulating layer 115-1 and 115-2 and protecting the LED element 150 and the pixel circuit PC from external impact. The buffer layer 116 may be an optical clear adhesive (OCA) or an optical clear resin (OCR) in accordance with an embodiment of the present disclosure, but is not limited thereto.

The method of manufacturing a display device can separately perform the transfer process of attaching a vertical LED element in a panel using an adhesive member and an electric connection process using photolithography, as described above. Accordingly, it may be possible to considerably reduce the process time, in comparison to eutectic bonding, for simultaneously achieving a physical adhesion and an electrical connection or a method using an ACF, and it may also be possible to achieve equivalent luminance in a small area in comparison to a lateral LED element, so embodiments may be advantageous in terms of cost.

FIGS. 6A to 6E are cross-sectional views showing a method of installing an LED element in a panel according to an example embodiment of the present disclosure.

FIGS. 6A to 6E are views illustrating operations after the first insulating layer 115-1 of FIG. 5G is formed on the substrate 110, and show forming of the second insulating layer 115-2, the pixel electrode PE, and the buffer layer 116. Accordingly, the operations described with reference to FIGS. 5A to 5G may be applied in the same way to the second embodiment of the present disclosure.

Figure 6A:
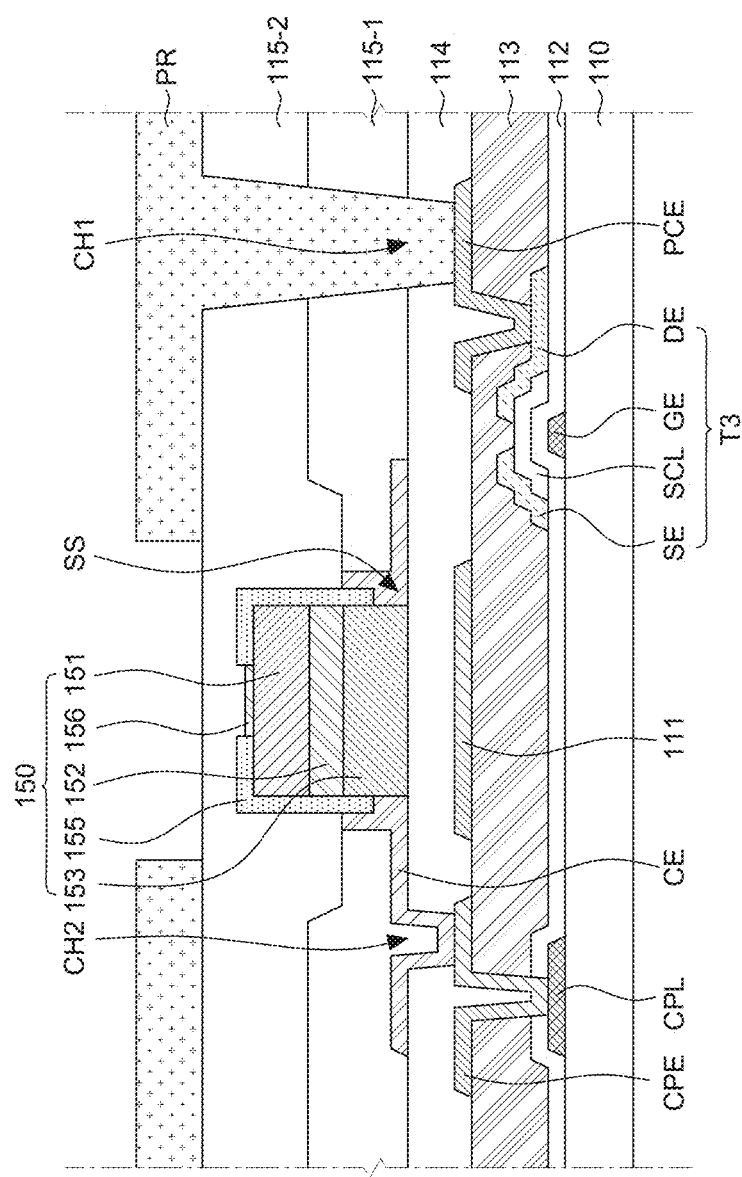
FIGS. 6A to 6E are cross-sectional views showing a method of installing an LED element in a panel according to an example embodiment of the present disclosure.

FIG. 6A shows a state in which a portion of the second insulating layer 115-2 has been primarily patterned on the substrate 110, and a photoresist has been formed on the second insulating layer 115-2 for secondary patterning. The operation of primarily patterning the second insulating layer 115-2 may include depositing the second insulating layer 115-2 on the LED element 150 and the substrate 110, and removing the second insulating layer 115-2 on the first contact hole CH1. The second insulating layer 115-2 may be formed to have a greater thickness than the LED element 150 to cover the common electrode CE exposed to the air to suppress a short between the common electrode CE and the auxiliary electrode 156. The second insulating layer 115-2 on the first contact hole CH1 may be removed by photolithography.

A photoresist PR may be formed on the second insulating layer 115-2 to perform secondary patterning for exposing the top of the LED element 150. For example, the photoresist PR may not be applied to the LED element 150 and an adjacent area around the LED element 150. Because the photoresist PR is not applied to the adjacent area around the LED element 150, including the LED element 150, an alignment tolerance that may be generated when the LED element 150 is transferred to a panel can be increased. For example, when the second insulating layer 115-2 patterned without the LED element 150 accurately aligned is formed with the focus on the top of the LED element 150, e.g., the auxiliary electrode 156, such that the top of the auxiliary electrode 156 is exposed to the air, the auxiliary electrode 156 to be brought in contact with a pixel electrode PE later may be partially or completely covered with the second insulating layer 115-2. Accordingly, a photoresist PR may be applied such that the patterned second insulating layer 115-2 can expose the top of the LED element 150 and the portion around the LED element 150.

Figure 6B:
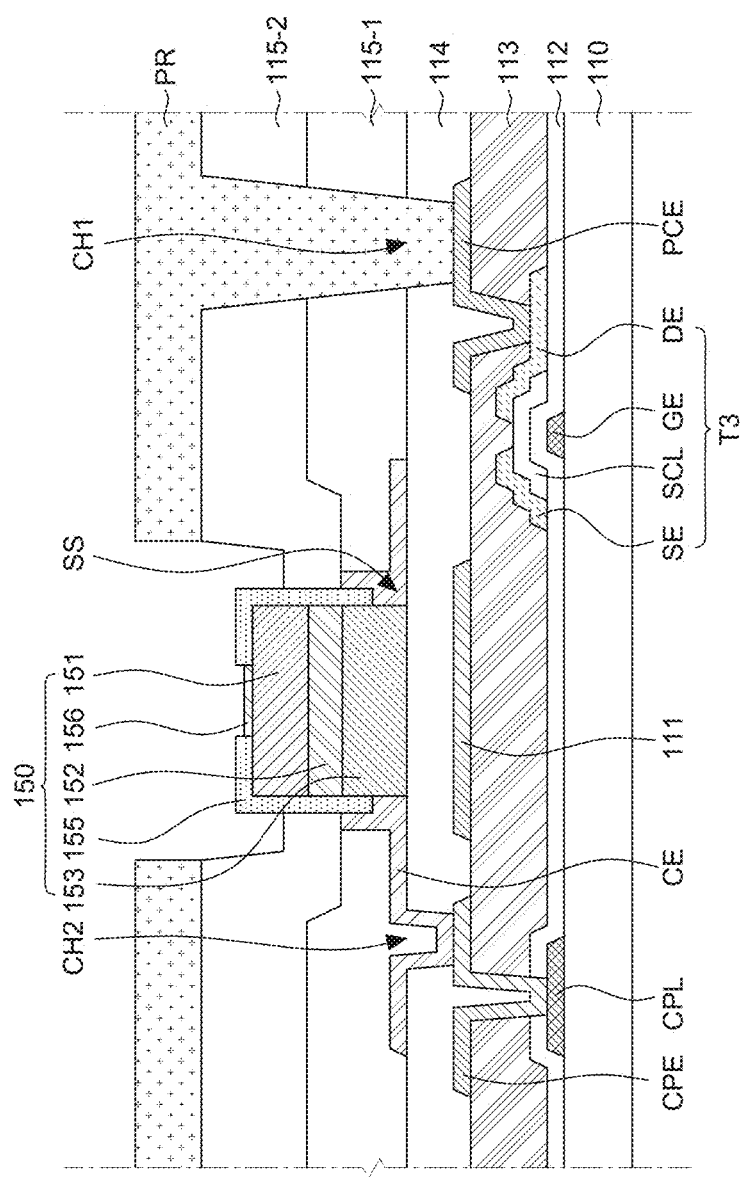
Figure 6C:
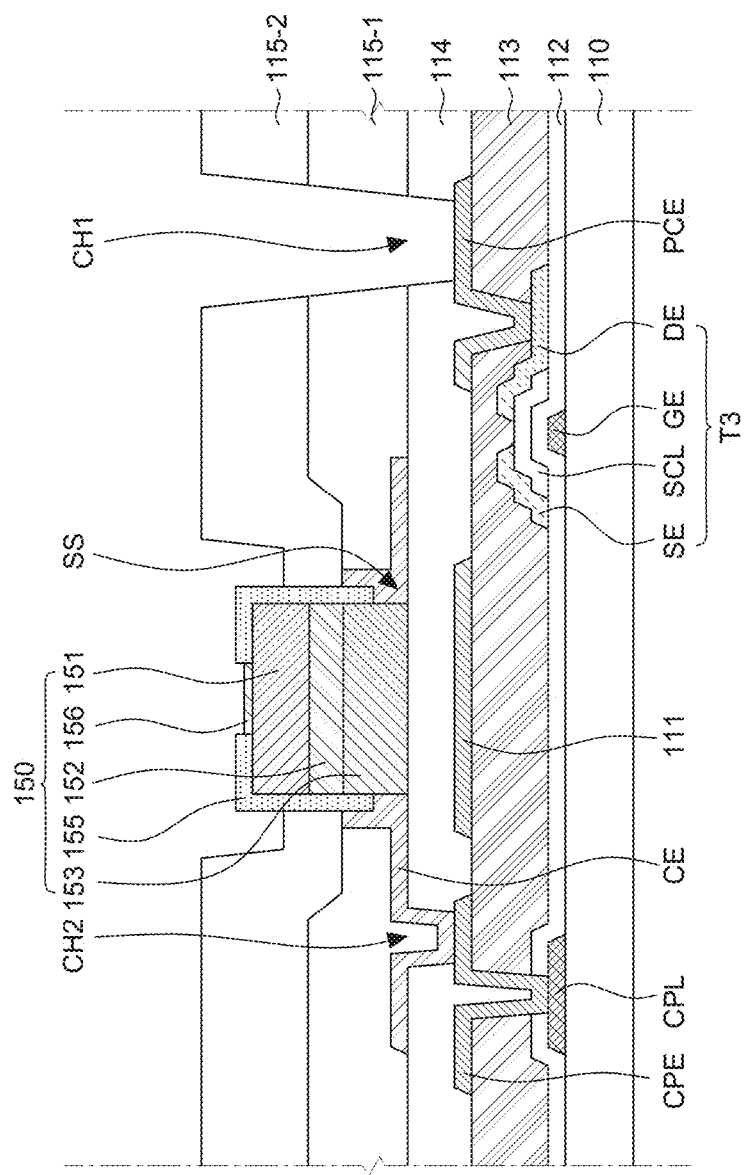

With reference to FIG. 6B, a portion of the second insulating layer 115-2, in the area without the photoresist PR formed, may be removed by dry etching. Because the second insulating layer 115-2 is removed such that the top of and the portion around the LED element 150, e.g., portions of the auxiliary electrode 156 and the encapsulation film 155, can be exposed, the common electrode CE can be kept insulated by the second insulating layer 115-2. With reference to FIG. 6G, the photoresist PR may be removed, e.g., by a strip solution.

According to the above description, patterning may be performed twice to form the second insulating layer 115-2, but it may be possible to form the second insulating layer 115-2 through one patterning, using a half-tone mask, to simplify the process. The second insulating layer 115-2 may be deposited on the LED element 150 and the front surface of the substrate 110, and then exposure may be performed on the second insulating layer 115-2, e.g., using a half-tone mask to expose the top of the LED element 150 and the first contact hole CH1, thereby being able to selectively remove the second insulating layer 115-2. For example, light transmittance of the half-tone mask may be different in the area corresponding to the top of the LED element 150 and in the area corresponding to the first contact hole CH1. For example, a half-tone mask that is a partial transmissive film may be used for the area corresponding to the top of the LED element 150.

Figure 6D:
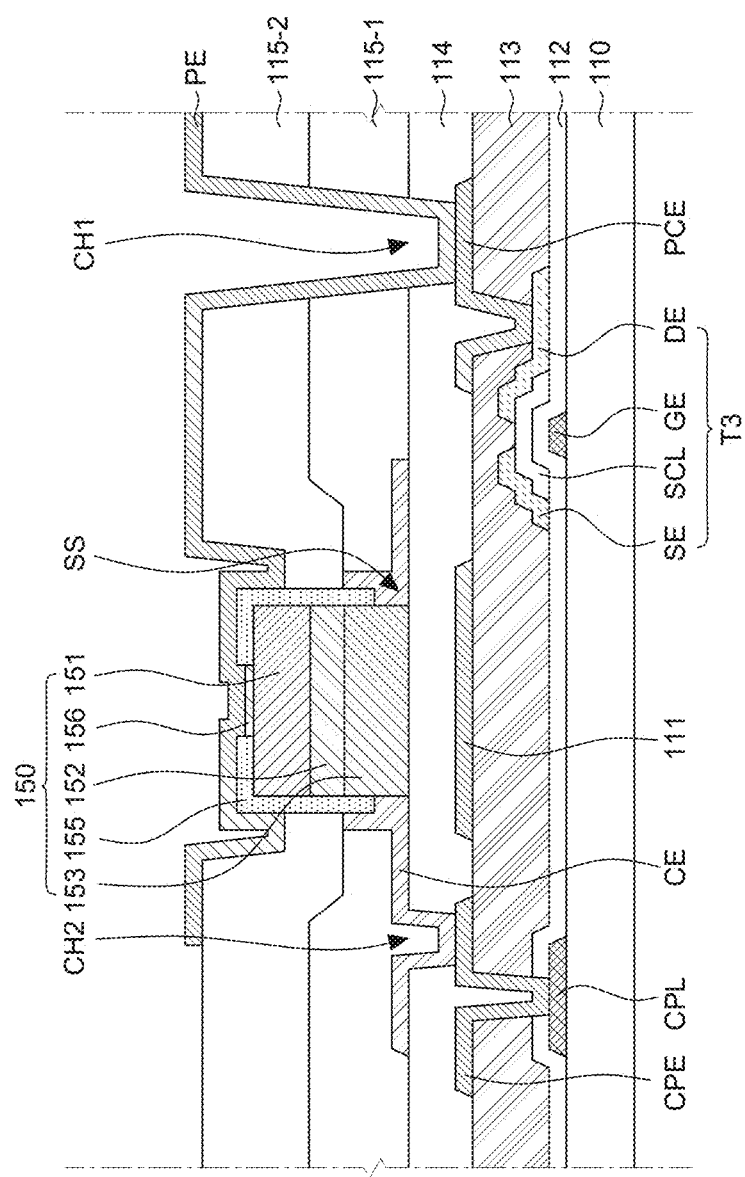

With reference to FIG. 6D, a pixel electrode PE, which may be an electrode for providing a voltage applied through the drain electrode DE of the third transistor T3 to the first electrode 151, may be formed on the substrate 110, including the first contact hole CH1 formed on the pixel connection electrode PCE and on the top of the LED element 150 that may be exposed by the second insulating layer 115-2. Patterning for removing the portions of the pixel electrode PE, which may be formed in areas other than the portion for electrically connecting the auxiliary electrode 156 and the pixel connection electrode PCE, may be performed. Accordingly, a pixel electrode PE insulated from adjacent subpixels can be formed.

Figure 6E:
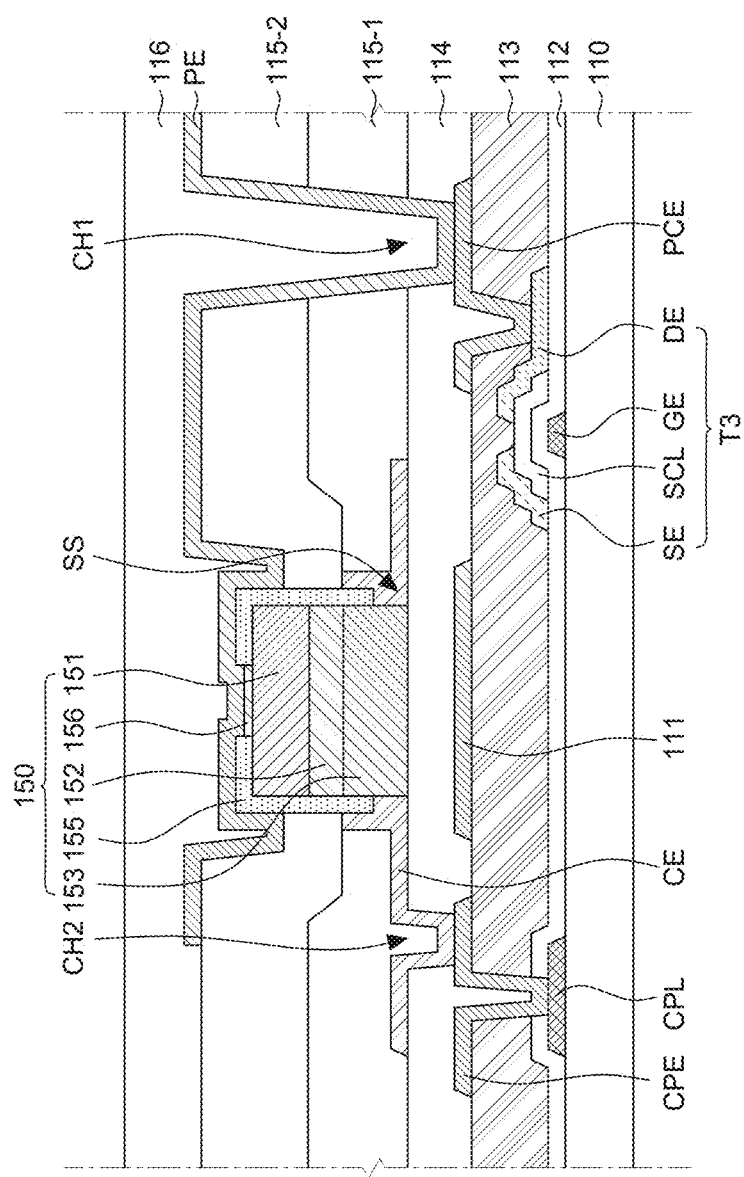

With reference to FIG. 6E, the display device may further include a buffer layer 116 on the front surface of the substrate 110. The buffer layer 116 may be disposed on the substrate 110 to cover the entire insulating layer 115-1 and 115-2 having the common electrode CE, thereby providing a flat surface on the insulating layer 115-1 and 115-2 and protecting the LED element 150 and the pixel circuit PC from external impact. The buffer layer 116 may be an optical clear adhesive (OCA) or an optical clear resin (OCR) in accordance with an embodiment of the present disclosure, but is not limited thereto.

The method of manufacturing a display device can separately perform the transfer process of attaching a vertical LED element in a panel using an adhesive member and an electric connection process using photolithography, as described above. Accordingly, it may be possible to considerably reduce the process time, in comparison to eutectic bonding, for simultaneously performing a physical adhesion and an electrical connection or a method using an ACF, and it may also be possible to achieve equivalent luminance in a small area in comparison to a lateral LED element, so embodiments may be advantageous in terms of cost.

A display device and a method of manufacturing the same according to an example embodiment of the present disclosure may be described as follows.

According to an embodiment of the present disclosure, a display device may include: a substrate; a pixel circuit on the substrate, the pixel circuit including: a gate electrode, a drain electrode, and a source electrode; a vertical LED element on the substrate, the vertical LED element including: a first electrode, an active layer under the first electrode, and a second electrode under the active layer; an encapsulation film surrounding the vertical LED element, the encapsulation film exposing a portion of a side of the second electrode; a first connection electrode electrically connected to the first electrode; and a second connection electrode electrically connected to the second electrode.

For example, in the display device according to an embodiment of the present disclosure, the second connection electrode may be electrically connected to the second electrode via the exposed portion of the side of the second electrode. For example, in the display device according to an embodiment of the present disclosure, the second connection electrode may be configured to seal the second electrode at the exposed portion of the side of the second electrode.

For example, in the display device according to an embodiment of the present disclosure, the encapsulation film may completely surround the first electrode and the active layer, and may at least partially surround the second electrode. For example, the display device according to an embodiment of the present disclosure may further include an adhesive member between the vertical LED element including the second connection electrode and the substrate.

For example, the display device according to an embodiment of the present disclosure may further include a common power line on a same layer as the gate electrode, and a protective layer on the pixel circuit, and the second connection electrode may be electrically connected to the common power line through at least one contact hole penetrating through the protective layer and the adhesive member. For example, the display device according to an embodiment of the present disclosure may further include a first insulating layer surrounding the vertical LED element on the adhesive member, and a second insulating layer on the first insulating layer.

For example, in the display device according to an embodiment of the present disclosure, the second insulating layer may partially or completely expose a top surface of the vertical LED element. For example, in the display device according to an embodiment of the present disclosure, the first connection electrode may be electrically connected to the pixel circuit through one or more contact holes penetrating through the first insulating layer, the second insulating layer, and the adhesive member.

For example, in the display device according to an embodiment of the present disclosure, the second insulating layer may cover the second connection electrode and the first insulating layer. For example, in the display device according to an embodiment of the present disclosure, the vertical LED element may further include an auxiliary electrode in ohmic contact with the first electrode, and the encapsulation film may cover at least a portion of the auxiliary electrode.

According to an embodiment of the present disclosure, a method of manufacturing a display device may include: providing a substrate including a pixel circuit, transferring a vertical LED element to the substrate including the pixel circuit, providing a second connection electrode on the vertical LED element, providing an insulating layer on the second connection electrode, and providing a first connection electrode on the insulating layer. The first connection electrode may be on and in electrical contact with a top surface of the vertical LED element, and the second connection electrode may be on and in electrical contact with an exposed portion of a side of a lower portion of the vertical LED element.

For example, in the method according to an embodiment of the present disclosure, the providing the insulating layer may include: providing a first insulating layer on the second connection electrode, and providing a second insulating layer on the first insulating layer. For example, in the method according to an embodiment of the present disclosure, the providing the first insulating layer may include: depositing the first insulating layer, patterning a photoresist on the first insulating layer, etching the first insulating layer, at least partially exposing the vertical LED element and the second connection electrode, and stripping the photoresist.

For example, in the method according to an embodiment of the present disclosure, the etching of the first insulating layer may include maintaining the second connection electrode in contact with the side of the lower portion of the vertical LED element. For example, in the method according to an embodiment of the present disclosure, the forming of a second insulating layer may include providing the second insulating layer, such that the second insulating layer may completely cover the second connection electrode. For example, the method according to an embodiment of the present disclosure may further include providing an adhesive member for attaching the vertical LED element to the substrate, and the providing the first connection electrode on the vertical LED element may include connecting the first connection electrode to a source electrode or a drain electrode of a transistor in the pixel circuit through contact holes penetrating through the adhesive member and the insulating layer.

For example, in the method according to an embodiment of the present disclosure, the providing the vertical LED may include: providing a second electrode on a growth substrate, providing an active layer on the second electrode, providing a first electrode on the active layer, providing an auxiliary electrode on the first electrode, and providing an encapsulation film on the auxiliary electrode, and the first connection electrode may be electrically connected to the first electrode through the auxiliary electrode. For example, in the method according to an embodiment of the present disclosure, a portion of the encapsulation film that covers the vertical LED element adjacent to the growth substrate may be removed when the vertical LED element is separated from the growth substrate.

For example, in the method according to an embodiment of the present disclosure, the second connection electrode may be in contact with the second electrode of the vertical LED element exposed due to removal of a portion of the encapsulation film. For example, in the method according to an embodiment of the present disclosure, the providing the insulating layer may include: depositing the insulating layer, and removing the insulating layer on a contact hole for connecting the top of the vertical LED element and the first connection electrode with the pixel circuit, using a half-tone mask.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:
1. A display device, comprising:
a substrate;
a pixel circuit on the substrate, the pixel circuit comprising:
 a gate electrode;
 a drain electrode; and
 a source electrode;
a vertical LED element on the substrate, the vertical LED element comprising:
 a first electrode;
 an active layer under the first electrode; and
 a second electrode under the active layer;
an encapsulation film surrounding the vertical LED element, the encapsulation film exposing a portion of a lateral side of the second electrode;
a first connection electrode electrically connected to the first electrode; and
a second connection electrode directly and electrically connected to the second electrode via the exposed portion of the lateral side of the second electrode.

2. The display device of claim 1, wherein the second connection electrode is configured to seal the second electrode at the exposed portion of the lateral side of the second electrode.

3. The display device of claim 1, wherein the encapsulation film completely surrounds the first electrode and the active layer, and at least partially surrounds the second electrode.

4. The display device of claim 1, further comprising an adhesive member between the vertical LED element comprising the second connection electrode and the substrate.

5. The display device of claim 4, further comprising:
a common power line on a same layer as the gate electrode; and
a protective layer on the pixel circuit, wherein the second connection electrode is electrically connected to the common power line through at least one contact hole penetrating through the protective layer and the adhesive member.

6. The display device of claim 5, further comprising:
a first insulating layer surrounding the vertical LED element on the adhesive member; and
a second insulating layer on the first insulating layer,
wherein the second insulating layer partially or completely exposes a top surface of the vertical LED element.

7. The display device of claim 6, wherein the first connection electrode is electrically connected to the pixel circuit through one or more contact holes penetrating through the first insulating layer, the second insulating layer, and the adhesive member.

8. The display device of claim 6, wherein the second insulating layer covers the second connection electrode and the first insulating layer.

9. The display device of claim 1, wherein:
the vertical LED element further comprises an auxiliary electrode in ohmic contact with the first electrode; and
the encapsulation film covers at least a portion of the auxiliary electrode.

* * * * *